US012309556B2

(12) United States Patent
Sakai

(10) Patent No.: US 12,309,556 B2
(45) Date of Patent: May 20, 2025

(54) AUDIO CIRCUIT

(71) Applicant: ROHM CO., LTD., Kyoto (JP)

(72) Inventor: Mitsuteru Sakai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 172 days.

(21) Appl. No.: 18/193,126

(22) Filed: Mar. 30, 2023

(65) Prior Publication Data

US 2023/0247354 A1 Aug. 3, 2023

Related U.S. Application Data

(63) Continuation of application No. PCT/JP2021/031522, filed on Aug. 27, 2021.

(30) Foreign Application Priority Data

Sep. 30, 2020 (JP) .................. 2020-166166

(51) Int. Cl.
*H04R 3/00* (2006.01)
*H04R 1/00* (2006.01)
(Continued)

(52) U.S. Cl.
CPC ................. *H04R 3/00* (2013.01); *H04R 1/06* (2013.01); *H04S 1/007* (2013.01); *H04R 2430/01* (2013.01); *H04R 2499/13* (2013.01)

(58) Field of Classification Search
CPC ...... H03F 3/2171; H03F 1/0222; H03F 1/523; H03F 3/213; H03F 2200/03; H04R 3/00;
(Continued)

(56) References Cited

U.S. PATENT DOCUMENTS 9,425,747 B2 * 8/2016 Bazarjani .............. H03F 1/0222
2012/0169420 A1 * 7/2012 Liu ....................... H03F 3/2173
330/251
(Continued)

FOREIGN PATENT DOCUMENTS

JP 2011082959 A 4/2011
JP 5618776 B2 11/2014
(Continued)

OTHER PUBLICATIONS

International Search Report for International Application No. PCT/JP2021/031522; Date of Mailing, Oct. 5, 2021; and PCT IPRP issued on Mar. 28, 2023, with Written Opinion of the ISA, Date of Mailing, Oct. 5, 2021.

(Continued)

*Primary Examiner* — David L Ton
(74) *Attorney, Agent, or Firm* — CANTOR COLBURN LLP

(57) ABSTRACT

An audio circuit is configured to allow an analog voltage to be input via its volume setting pin. A power supply pin receives a power supply voltage. A bias circuit generates a first reference voltage that corresponds to the analog voltage. A D/A converter converts a digital audio signal into an analog audio signal. A D/A converter has a variable voltage range with a full scale that can be changed according to the first reference voltage. A class D amplifier outputs an output pulse signal having a duty cycle that corresponds to the analog audio signal output from the D/A converter and having an amplitude that corresponds to the power supply voltage.

8 Claims, 16 Drawing Sheets

(51) Int. Cl.
*H04R 1/06* (2006.01)
*H04S 1/00* (2006.01)

(58) Field of Classification Search
CPC .. H04R 1/06; H04R 2430/01; H04R 2499/13; H04S 1/007
See application file for complete search history.

(56) References Cited

U.S. PATENT DOCUMENTS

2016/0373073 A1   12/2016  Kato
2023/0238926 A1*  7/2023  Sakai ..................... H03F 3/187
                                                        381/86

FOREIGN PATENT DOCUMENTS

JP        2016007005 A    1/2016
JP        2017009440 A    1/2017

OTHER PUBLICATIONS

JPO Notice of Reasons for Refusal for corresponding JP Application No. 2022-553551; Issued Apr. 8, 2025.

* cited by examiner

AUDIO CIRCUIT

CROSS REFERENCE TO RELATED APPLICATIONS

This application is a continuation under 35 U.S.C. § 120 of PCT/JP2021/031522, filed Aug. 27, 2021, which is incorporated herein reference, and which claimed priority to Japanese Application No. 2020-166166, filed Sep. 30, 2020, the entire content of which is also incorporated herein by reference.

BACKGROUND

1. Technical Field

The present disclosure relates to an audio amplifier circuit that drives a speaker or headphones.

2. Description of the Related Art

As a power amplifier that drives an electroacoustic conversion element such as a speaker, headphones, or the like, a high-efficiency class D amplifier is employed. FIG. 1 is a block diagram showing an audio system 100R employing such a class D amplifier. The audio system 100R mainly includes a speaker 102, a low pass filter 104, a sound source 106, and a class D amplifier circuit 900R. The sound source 106 generates a digital audio signal $D_{IN}$.

The class D amplifier circuit 900R generates an output pulse signal $S_{OUT}$ having a duty cycle that corresponds to the digital input audio signal $D_{IN}$. The low-pass filter 104 removes high-frequency components of the output pulse signal $S_{OUT}$ of the class D amplifier circuit 900R and supplies the output pulse signal $S_{OUT}$ to the speaker 102.

The class D amplifier circuit 900R shown in FIG. 1 includes an audio interface circuit 902, a serial interface circuit 904, an output stage 930, an integrator 910, a Pulse with Modulation (PWM) comparator 920.

The audio interface circuit 902 receives the digital audio signal $D_{IN}$ from the sound source 106, and outputs a PWM signal $D_{PWM}$. A level shift circuit 906 shifts the level of the amplitude of the PWM signal $D_{PWM}$ so as to generate a PWM signal having a voltage level (e.g., 5 V system) that matches the input voltage range of the downstream circuits.

The integrator 910 integrates a difference between the input audio signal $S_{IN}$ and a feedback signal $S_{FB}$ that corresponds to the output pulse signal $S_{OUT}$.

The PWM comparator 920 compares the output of the integrator 910 with a reference voltage so as to output a pulse signal $S_{PWM}$.

The output stage 930 includes a driver 932 and a half-bridge circuit (inverter circuit) 934. The driver 932 drives the half-bridge circuit 934 according to the pulse signal $S_{PWM}$.

FIG. 2 is a block diagram showing an audio system 100S employing a class D amplifier. The audio interface circuit 903 outputs a digital audio signal (e.g., PCM signal) $S_{PCM}$ that corresponds to the digital audio signal $D_{IN}$ thus received. A D/A converter 908 converts the digital audio signal $S_{PCM}$ output from the audio interface circuit 903 into an analog input audio signal $S_{IN}$.

The integrator 910 integrates a difference between the input audio signal $S_{IN}$ and a feedback signal $S_{FB}$ that corresponds to the output pulse signal $S_{OUT}$. A triangle wave generating circuit 940 generates a periodic signal $V_{OSC}$ having a pulse width modulation carrier frequency. The PWM comparator 920 compares the output of the integrator 910 with the periodic signal $V_{OSC}$, so as to output a pulse signal $S_{PWM}$.

The amplitude (time average) of the output pulse signal $S_{OUT}$ of the class D amplifier circuits 900R and 900S shown FIGS. 1 and 2, i.e., the volume of the speaker 102, is determined by the power supply voltage Vcc of the half-bridge circuit 934. In a case in which Vcc=14.4 V and the load impedance=4Ω in an in-vehicle device, a fixed output of 26 W is provided.

In a case in which the output, i.e., the volume, is to be changed, a digital volume is required. In a case in which such a device is configured as an audio product requiring high sound quality, such a digital volume function is implemented in a System On Chip (SoC) or Digital Signal Processor/Digital Sound Processor (DSP). Accordingly, the digital volume function thus implemented may preferably be employed.

However, in a case in which such a device is employed to reproduce a warning sound or a simple voice signal, in many cases, the sound source 106 has no digital volume function. Accordingly, in order to support such a digital volume function, specifically, in the class D amplifier circuit 900R shown in FIG. 1, the digital volume function is implemented in the audio interface circuit 902. The serial interface circuit 904 receives the volume setting value from a microcontroller 108 configured as a host processor and sets the volume gain of the audio interface circuit 902. The audio interface circuit 902 outputs a PWM signal $D_{PWM}$ having a duty cycle scaled according to the volume.

In a class D amplifier circuit 900S shown in FIG. 2, the digital volume function is implemented in the audio interface circuit 903. The audio interface circuit 903 outputs the digital audio signal $S_{PCM}$ having an amplitude adjusted according to the volume.

As described above, with conventional techniques, the digital volume function is required to be implemented in the audio interface circuit 903, leading to an increased cost.

Furthermore, in order to control the digital volume function, transmission of the volume setting command from the microcontroller 108 is required.

SUMMARY

The present disclosure has been made in order to solve such a problem.

An audio circuit according to the present disclosure includes: a volume setting pin structured to receive an analog voltage; a power supply pin structured to receive a power supply voltage; a bias circuit structured to generate a first reference voltage that corresponds to the analog voltage; a D/A converter structured to convert a digital audio signal into an analog audio signal with a voltage range having a full scale that is variable according to the first reference voltage; and a class D amplifier structured to output an output pulse signal having a duty cycle that corresponds to the analog audio signal output from the D/A converter, and having an amplitude that corresponds to the power supply voltage.

It should be noted that any combination of the components described above, or any manifestation of the present invention may be mutually substituted between a method, apparatus and so forth, which are also effective as an embodiment of the present invention. The description of the items (means for solving the problems) is by no means intended to describe all the indispensable features of the present invention. That is to say, any sub-combination of the features as described is also encompassed in the technical scope of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1:
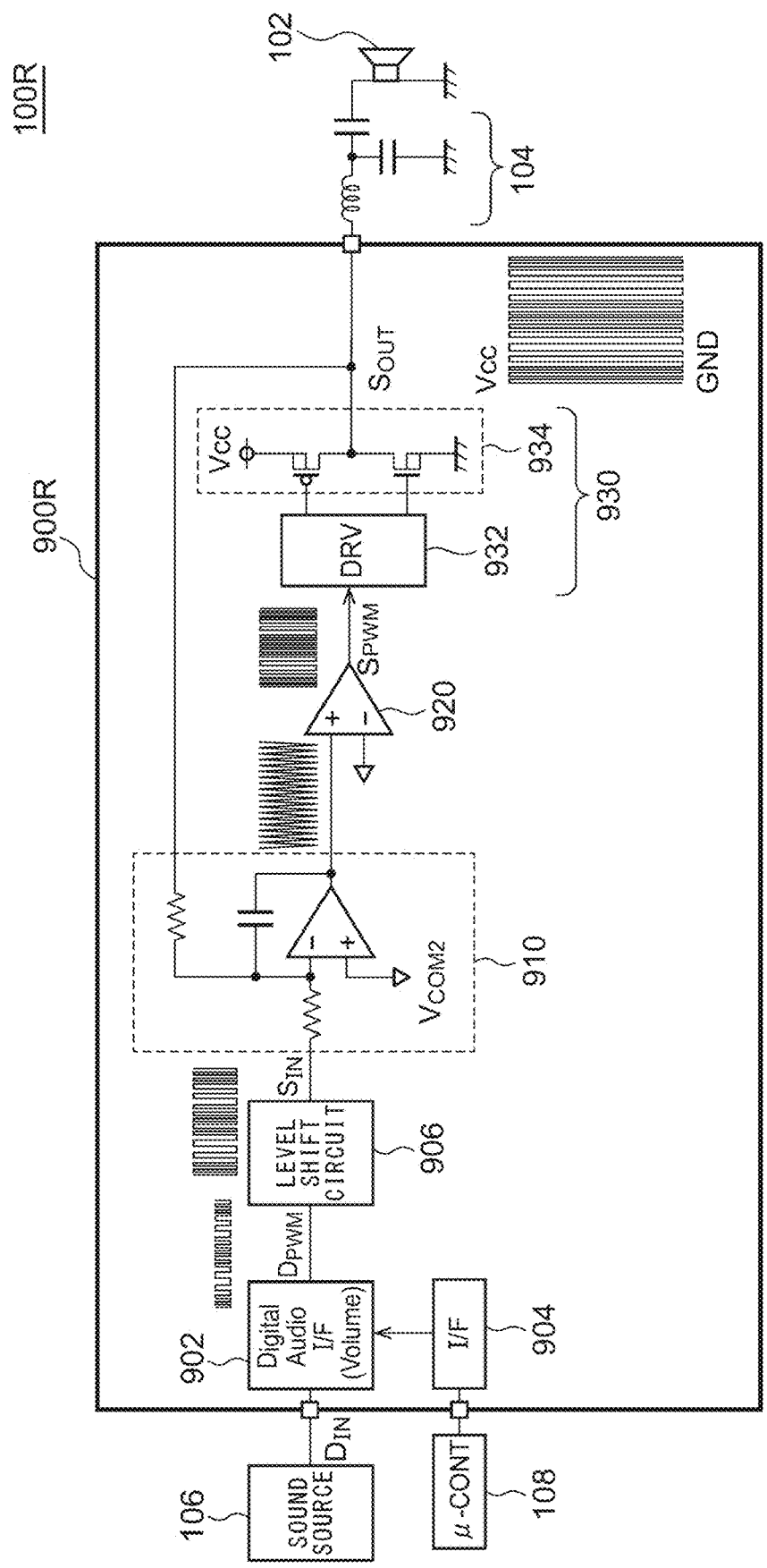
FIG. 1 is a block diagram showing an audio system employing a class D amplifier.

Description will be made regarding the outline of several exemplary embodiments of the present disclosure. The outline is a simplified explanation regarding several concepts of one or multiple embodiments as a prelude to the detailed description described later in order to provide a basic understanding of the embodiments. That is to say, the outline described below is by no means intended to restrict the scope of the present invention and the present disclosure. Furthermore, the outline described below is by no means a comprehensive outline of all the possible embodiments. That is to say, the outline described below by no means restricts essential components of the embodiments. For convenience, in some cases, an "embodiment" as used in the present specification represents a single or multiple embodiments (examples and modifications) disclosed in the present specification.

An audio circuit according to one embodiment includes: a volume setting pin structured to receive an analog voltage; a power supply pin structured to receive a power supply voltage; a bias circuit structured to generate a first reference voltage that corresponds to the analog voltage; a D/A converter structured to convert a digital audio signal into an analog audio signal with a voltage range having a full scale that is variable according to the first reference voltage; and a class D amplifier structured to output an output pulse signal having a duty cycle that corresponds to the analog audio signal output from the D/A converter, and having an amplitude that corresponds to the power supply voltage.

With this configuration, the duty cycle of the output pulse signal generated by the class D amplifier is scaled according to the first reference voltage, thereby allowing the volume to be controlled.

In one embodiment, the bias circuit may include a first resistor provided between the volume setting pin and the power supply pin; and a second resistor provided between the volume setting pin and a ground. In a case in which no external analog voltage is applied to the volume setting pin, a voltage occurs at the volume setting pin determined by the voltage dividing ratio of the first resistor and the second resistor. Accordingly, such an arrangement allows the volume that corresponds to this voltage level to be employed as a default volume.

In one embodiment, the class D amplifier may include: an integrator structured to receive the analog audio signal and the output pulse signal; a periodic voltage generating circuit structured to generate a periodic voltage having a triangle waveform or a sawtooth waveform; a Pulse Width Modulation (PWM) comparator structured to compare an output of the integrator with the periodic voltage; a bridge circuit; and a driver structured to drive the bridge circuit according to an output of the PWM comparator.

In one embodiment, the bias circuit may further generate a second reference voltage obtained by dividing the power supply voltage in addition to the first reference voltage. Also, the second reference voltage may be supplied to the integrator.

In one embodiment, the periodic voltage generating circuit may generates a periodic voltage with the second reference voltage as a midpoint level.

In one embodiment, the audio circuit may be monolithically integrated on a single substrate. Examples of such a "monolithically integrated" arrangement include: an arrangement in which all the circuit components are formed on a substrate; and an arrangement in which principal circuit components are monolithically integrated. Also, a part of the circuit components such as resistors or capacitors may be arranged in the form of components external to such a substrate in order to adjust the circuit constants. By integrating the circuit on a single chip, such an arrangement allows the circuit area to be reduced and allows the circuit elements to have uniform characteristics.

Embodiments

Description will be made below regarding preferred embodiments with reference to the drawings. The same or similar components, members, and processes are denoted by the same reference numerals, and redundant description thereof will be omitted as appropriate. The embodiments have been described for exemplary purposes only and are by no means intended to restrict the present disclosure or the present invention. Also, it is not necessarily essential for the present disclosure or the present invention that all the features or a combination thereof be provided as described in the embodiments.

In the present specification, the state represented by the phrase "the member A is coupled to the member B" includes a state in which the member A is indirectly coupled to the member B via another member that does not affect the electrical connection between them, or that does not damage the functions of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C, via another member that does not affect the electrical connection between them, or that does not damage the functions of the connection between them, in addition to a state in which they are directly coupled.

Figure 3:
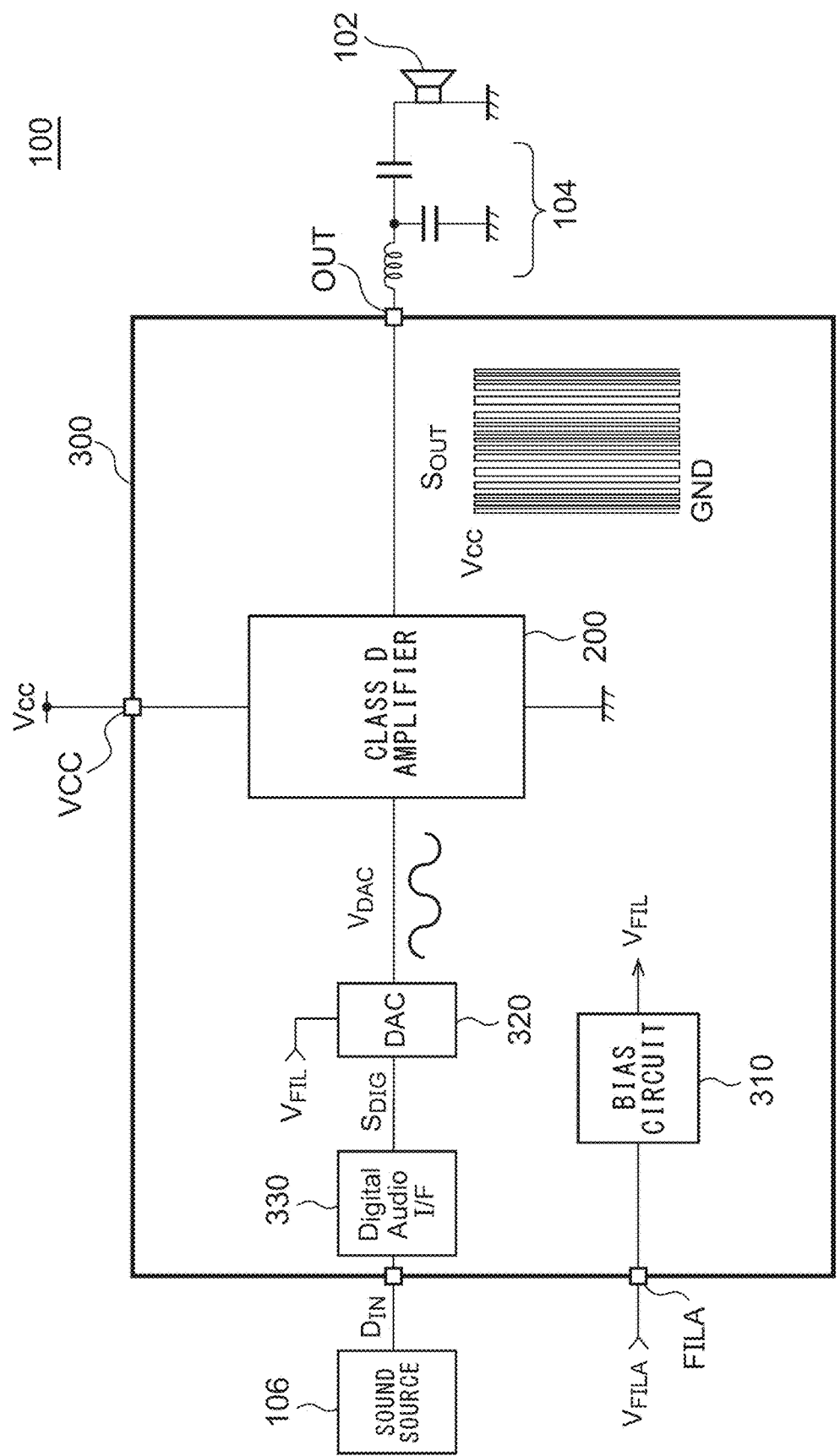
FIG. 3 is a block diagram showing an audio system provided with an audio circuit according to an embodiment.

FIG. 3 is a block diagram showing an audio system 100 provided with an audio circuit 300 according to an embodiment. The audio system 100 includes a speaker 102, a low pass filter 104, a sound source 106, and an audio circuit 300. The audio circuit 300 is configured as a function IC (Integrated Circuit) integrated on a single semiconductor chip.

The audio circuit 300 includes a bias circuit 310, a D/A converter 320, a digital audio interface circuit 330, a class D amplifier circuit 200, a volume setting pin FILA, and a power supply pin VCC. An external analog voltage $V_{FILA}$ can be input to the volume setting pin FILA. The power supply voltage Vcc is supplied to the power supply pin VCC.

The digital audio interface circuit 330 receives a digital audio signal $D_{IN}$ from the sound source 106. The format of the digital audio signal $D_{IN}$ is not restricted in particular. Examples of the formats include Inter IC Sound (I²S).

The bias circuit 310 generates a first reference voltage $V_{FIL}$ that corresponds to the analog voltage $V_{FILA}$. The first reference voltage $V_{FIL}$ may have the same voltage level as that of the analog voltage $V_{FILA}$. Also, the first reference voltage $V_{FIL}$ may have a voltage level obtained by multiplying the analog voltage $V_{FILA}$ by a predetermined coefficient.

The D/A converter 320 converts a digital audio signal $S_{DIG}$ into an analog audio signal $V_{DAC}$. The first reference voltage $V_{FIL}$ is supplied to the D/A converter 320. The D/A converter 320 is configured to be capable of setting the full-scale voltage range $V_{FULL}$, i.e., the voltage width of 1 LSB.

The class D amplifier circuit 200 outputs the output pulse signal $S_{OUT}$ having a duty cycle duty that corresponds to the analog audio signal $V_{DAC}$ output from the D/A converter 320 and an amplitude that corresponds to the power supply voltage Vcc. The class D amplifier circuit 200 may be configured as a circuit designed using known techniques or a circuit that will become available in the future. The configuration thereof is not restricted in particular.

The above is the configuration of the audio circuit 300. Next, description will be made regarding the operation thereof.

Figure 4:
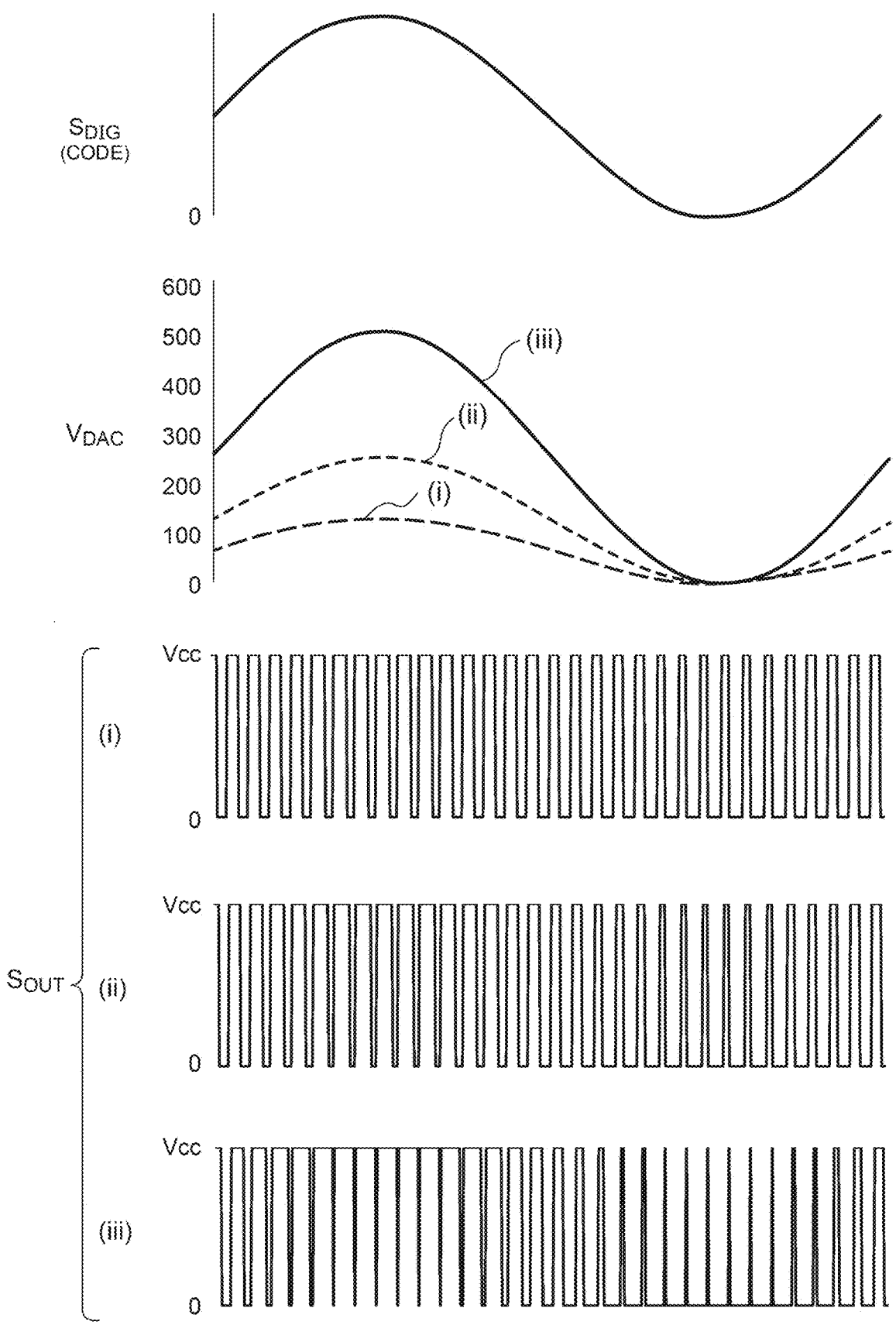
FIG. 4 is an operation waveform diagram of the audio circuit shown in FIG. 3.

FIG. 4 is an operation waveform diagram of the audio circuit 300 shown in FIG. 3. FIG. 4 shows the output voltage $V_{DIG}$, the output signal $V_{DAC}$ of the D/A converter 320, and the output pulse signal $S_{OUT}$ of the class D amplifier circuit 200. In this example, description will be made regarding an arrangement in which the digital audio signal $V_{DIG}$ is a sine wave. In the drawing, (i) through (iii) indicate different states in which the setting voltage $V_{FILA}$ of the volume setting pin FILA is set to different voltages. Specifically, the setting voltage $V_{FILA}$ is set to higher values in the order of (i), (ii), and (iii).

The amplitude of the output pulse signal $S_{OUT}$ of the class D amplifier circuit 200 is equal to the power supply voltage Vcc regardless of the setting voltage $V_{FILA}$. However, the duty cycle duty of the class D amplifier circuit 200 corresponds to the analog audio signal $V_{DAC}$ output from the D/A converter 320. That is to say, the duty cycle is scaled according to the setting voltage $V_{FILA}$.

The driving voltage $V_{DRV}$ supplied to the speaker 102 is an effective voltage (time average) of the output pulse $S_{OUT}$, which is represented by duty(t)×Vcc. With the gain of the class D amplifier circuit 200 as $g_D$, the driving voltage $V_{DRV}$ is represented by $g_D \times V_{DAC}(t)$.

The above is the operation of the audio circuit 300. With the audio circuit 300 provided with the volume setting pin FILA, this allows the amplitude of the driving voltage $V_{DRV}$ applied to the speaker 102 to be changed according to the setting voltage $V_{FILA}$ supplied to the volume setting pin FILA, thereby enabling volume control.

Figure 2:
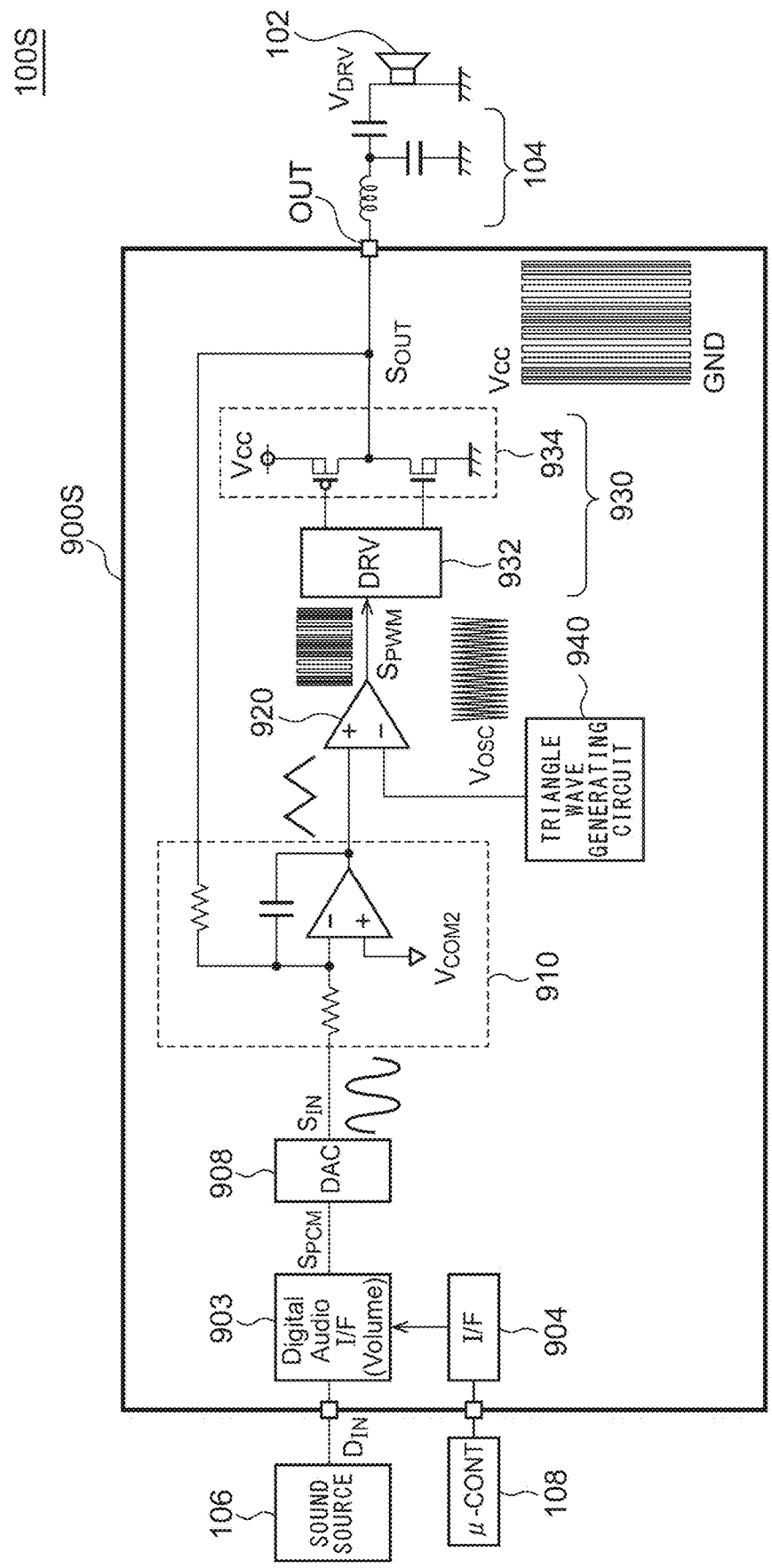
FIG. 2 is a block diagram showing an audio system employing a class D amplifier.

With the audio circuit 300, there is no need to implement the digital volume function in the digital audio interface circuit 330. This allows the circuit configuration to be simplified and allows the chip area to be reduced. Furthermore, such an arrangement requires no interface with the microcontroller 108 shown in FIGS. 1 and 2. Moreover, such an arrangement does not require the microcontroller 108.

The present disclosure encompasses various kinds of circuits that can be regarded as a circuit configuration shown in FIG. 3, or otherwise that can be derived from the aforementioned description. That is to say, the present invention is not restricted to a specific configuration. Specific description will be made below for clarification and ease of understanding of the essence of the present invention and the circuit operation. That is to say, the following description will by no means be intended to restrict the technical scope of the present invention.

Figure 5:
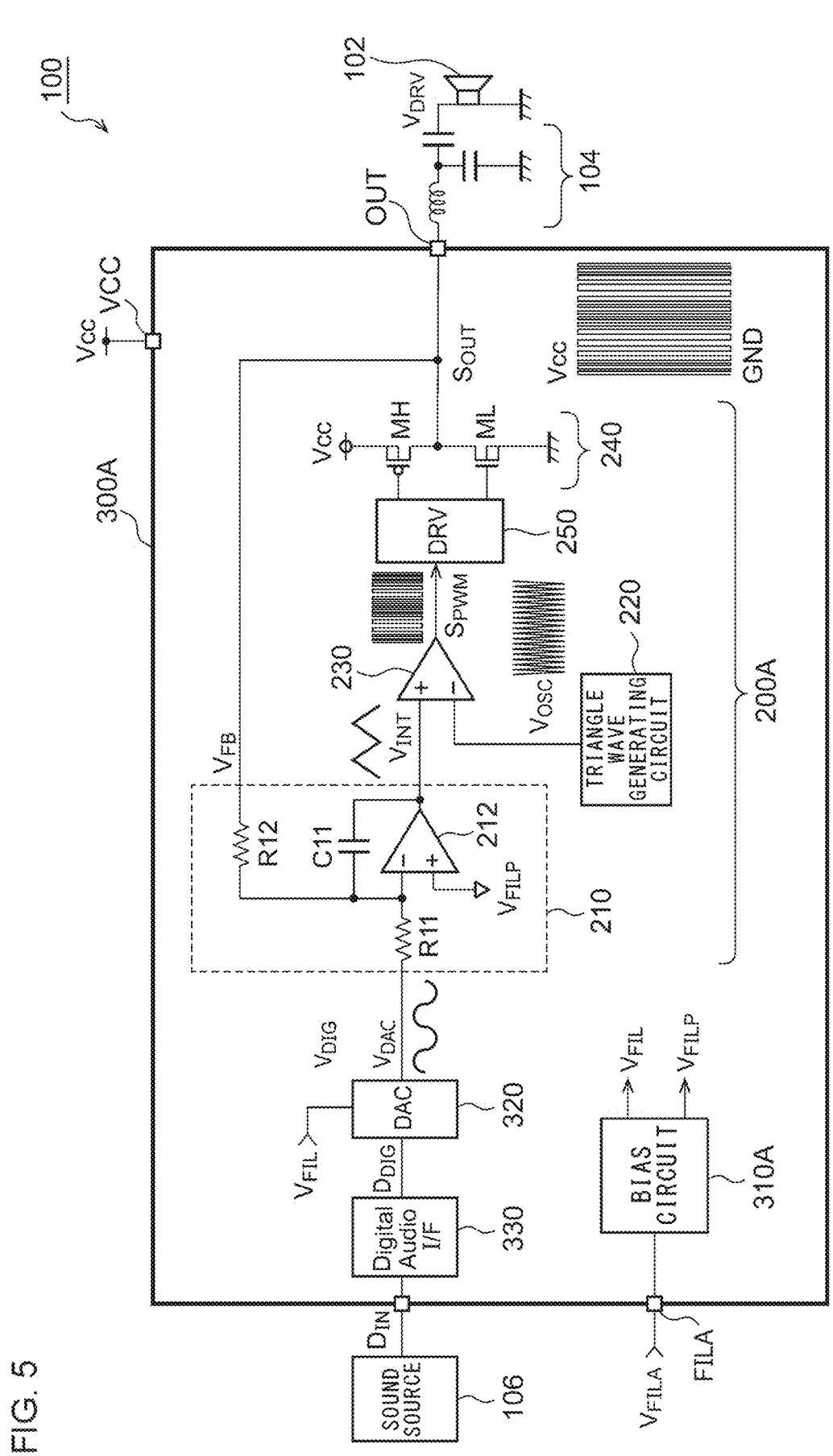
FIG. 5 is a circuit diagram showing an example of the audio circuit.

FIG. 5 is a circuit diagram showing an example (300A) of the audio circuit 300. In the example, the class D amplifier 200A is configured as a class D amplifier with a feedback function. The class D amplifier circuit 200A includes an integrator 210, a periodic voltage generating circuit 220, a PWM comparator 230, a bridge circuit 240, and a driver 250.

The bridge circuit 240 is configured as a push-pull inverter including a high-side transistor MH and a low-side transistor ML. The high-side transistor MH may be configured as a PMOS transistor or an NMOS transistor.

The integrator 210 includes resistors R11 and R12, a capacitor C11, and an error amplifier 212. The input voltage $V_{DAC}$ is input to an inverting input terminal (−) of the error amplifier 212 via the first resistor R11. Furthermore, a feedback voltage $V_{FB}$ that corresponds to the output pulse signal $S_{OUT}$ is input to the inverting input terminal (−) of the error amplifier 212 via the second resistor R12. The capacitor C11 is provided between the output and the inverting input terminal of the error amplifier 212. A second reference voltage $V_{FILP}$ is input to a non-inverting input terminal of the error amplifier 212. The gain $g_D$ of the class D amplifier 200A is represented by R12/R11. Furthermore, the second reference voltage $V_{FILP}$ determines the midpoint of the time-averaged waveform of the output pulse signal $S_{OUT}$.

The periodic voltage generating circuit 220 generates a periodic voltage $V_{OSC}$ having a triangle waveform or otherwise a sawtooth waveform. The periodic voltage $V_{OSC}$ is configured as a pulse-width modulation carrier wave. The periodic voltage $V_{OSC}$ has a PWM frequency that is higher than the audible frequency band (20 Hz to 20 kHz), and is determined in a range of several hundred kHz to several MHz. The PWM comparator 230 compares the output signal $V_{INT}$ of the integrator 210 with the periodic voltage $V_{OSC}$, and generates a PWM signal $S_{PWM}$ that switches between the high level and the low level according to the comparison result.

It should be noted that the configuration of the periodic voltage generating circuit 220 is not restricted in particular. The periodic voltage generating circuit 220 may generate the periodic voltage $V_{OSC}$ with 0 V as the bottom and with a predetermined voltage (e.g., 5 V) as the peak.

The driver 250 switches the high-side transistor MH and the low-side transistor ML of the bridge circuit 240 in a complementary manner according to the PWM signal $S_{PWM}$. The driver 250 inserts dead time such that the high-side transistor MH and the low-side transistor ML turn on at the same time.

The bias circuit 310A generates a first reference voltage $V_{FIL}$ that corresponds to the voltage $V_{FILA}$ applied to the volume setting pin FILA, and supplies the first reference voltage $V_{FIL}$ to the D/A converter 320. Furthermore, the bias circuit 310A generates a second reference voltage $V_{FILP}$ that corresponds to the voltage $V_{FILA}$ applied to the volume setting pin FILA, and supplies the second reference voltage $V_{FILP}$ to the error amplifier 212 of the integrator 210.

Figure 6:
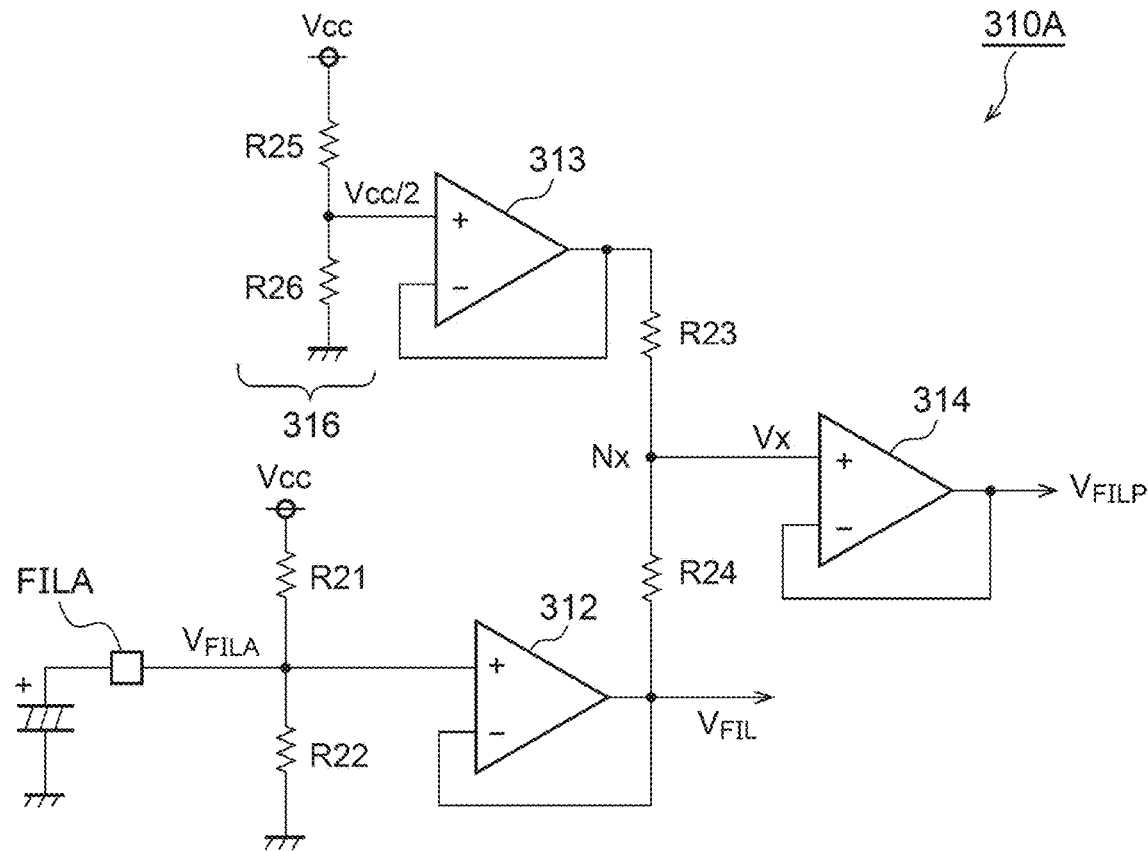
FIG. 6 is a circuit diagram showing an example configuration of a bias circuit shown in FIG. 5.

FIG. 6 is a circuit diagram showing an example configuration of the bias circuit 310A shown in FIG. 5. The bias circuit 310A includes a first resistor R21 through a sixth resistor R26, a first buffer 312, a second buffer 314, and a third buffer 313.

The volume setting pin FILA is configured to allow the setting voltage $V_{FILA}$ to be input from an external circuit. The first resistor R21 is provided between the power supply terminal (power supply line) VCC and the volume setting pin FILA. The second resistor R22 is provided between the volume setting pin FILA and the ground. In a case in which the volume setting pin FILA is set to a non-connection (NC) state in which no setting voltage $V_{FILA}$ is supplied from an external circuit, the voltage $V_{FILA(NC)}$ at the volume setting pin FILA is represented by $V_{FILA(NC)}=R22/(R21+R22)\times Vcc$.

The first buffer 312 has a high input impedance and low output impedance, and outputs the first reference voltage $V_{FILA}$ having the same voltage level as that of the setting voltage $V_{FILA}$.

The fifth resistor R25, the sixth resistor R26, and the third buffer 313 form a voltage dividing circuit 316 that divides the power supply voltage Vcc. In a case in which R25=R26, the voltage dividing circuit 316 generates a midpoint voltage of the power supply voltage Vcc, which is represented by Vcc/2. The midpoint voltage Vcc/2 is output via the buffer 313.

The third resistor R23 and the fourth resistor R24 are provided between the output of the voltage dividing circuit 316 and the output of the first buffer 312. The ratio of the resistance values of the third resistor R23 and the fourth resistor R24 may preferably be determined according to the gain $g_D$ of the integrator 210, i.e., according to the ratio of the resistance values of the first resistor R11 and the second resistor R12 shown in FIG. 5.

A voltage Vx, which is obtained as an internal division of the voltage Vcc/2 and the voltage $V_{FIL}$, occurs at a connection node Nx that couples the third resistor R23 and the fourth resistor R24.

$Vx=(V_{FIL}\times R23+Vcc/2\times R24)/(R23+R24)$

The second buffer 314 has a high input impedance and a low output impedance, and outputs the second reference voltage $V_{FILP}$ having the same level as that of the voltage Vx.

The above is the configuration of the audio circuit 300A. With the audio circuit 300A, this allows the full-scale output, i.e., the volume, to be controlled according to the voltage $V_{FILA}$ applied to the volume setting pin FILA.

Also, the second reference voltage $V_{FILP}$ generated by the bias circuit 310 shown in FIG. 6 may be supplied to the periodic voltage generating circuit 220. The periodic voltage generating circuit 220 may be configured to generate the periodic voltage $V_{OSC}$ having a half amplitude represented by Vcc/N (N represents a constant) with the midpoint level as the second reference voltage $V_{FILP}$. For example, in a case in which N=8, the bottom of the periodic voltage $V_{OSC}$ is represented by $V_{FILP}-Vcc/8$, and the peak thereof is represented by $V_{FILP}+Vcc/8$. It should be noted that the present invention is not restricted to such an arrangement in which N=8. For example, in a case in which N=2, the bottom of the periodic voltage $V_{OSC}$ is 0 V, and the peak is represented by $2\times V_{FILP}$.

In this case, this allows the amplitude of the periodic voltage $V_{OSC}$ to follow both the full scale of the output voltage $V_{DAC}$ of the D/A converter 320 and the power supply voltage Vcc. With this, such an arrangement is capable of securing the full-scale output level in the operating power supply voltage range even in a case in which the audio circuit 300 is designed to have a low total gain, thereby allowing the noise level to be reduced.

Furthermore, with the bias circuit 310A shown in FIG. 6 provided with the resistors R21 and R22, this is capable of operating the circuit even in a case in which the volume setting pin FILA is set to the non-connection (NC) state. The resistance values of the resistors R25 and R26 may preferably be determined so as to provide a volume value that is assumed to have the highest probability of use in this non-connection (NC) state. With this, in a case in which the volume value thus assumed is to be used in the audio circuit 300A, the designer of the audio system 100A has no need to supply an external signal to the volume setting pin FILA.

Furthermore, by employing the resistors R23 and R24, such an arrangement allows the reference voltage $V_{FILP}$ of the integrator 210 to be set appropriately.

Next, description will be made regarding an example configuration of the D/A converter 320.

Figure 7:
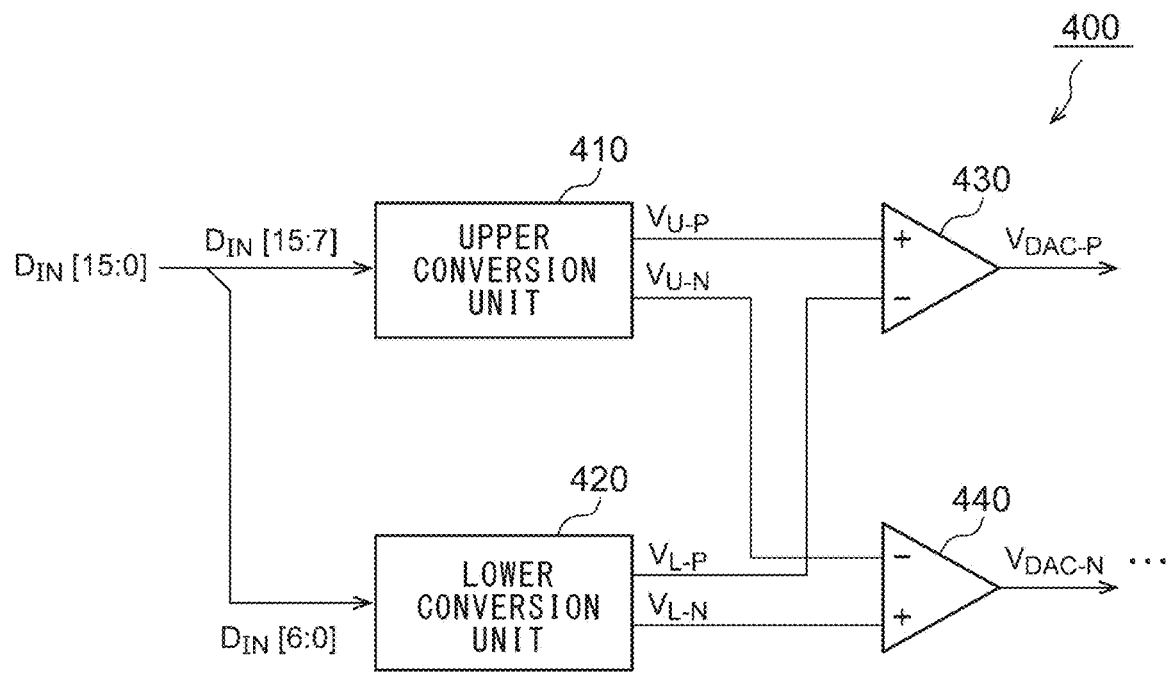
FIG. 7 is a block diagram showing an example configuration of a D/A converter.

FIG. 7 is a block diagram showing an example configuration (400) of the D/A converter 320. The D/A converter 400 includes an upper conversion unit 410, a lower conversion unit 420, a first amplifier 430, and a second amplifier 440.

The D/A converter 400 converts an n-bit (n≥2) digital signal $D_{IN}$ into a differential analog signal $V_{DAC\_P}$ and $V_{DAC\_N}$. It should be noted that appended suffixes P and N represent the positive phase and the negative phase, respectively.

The upper conversion unit 410 generates a first upper voltage $V_{U\_P}$ and a second upper voltage $V_{U\_N}$ that monotonically change with opposite phases with respect to the upper m bits (1≤m<n) of the digital signal $D_{IN}$. Description will be made below regarding an example in which m=9.

The lower conversion unit 420 generates a first lower voltage $V_{L\_P}$ and a second lower voltage $V_{L\_N}$ that monotonically change with opposite phases with respect to the lower (n−m) bits of the digital signal $D_{IN}$.

Description will be made below regarding an arrangement in which n=16, m=9, and (n−m)=7 bits. That is to say, the upper 9 bits of the digital signal, i.e., $D_{IN}[15:7]$, are supplied to the upper conversion unit 410, and the lower 7 bits of the digital signal, i.e., $D_{IN}[6:0]$, are supplied to the lower conversion unit 420.

Furthermore, description will be made in the present embodiment regarding an arrangement in which the first upper voltage $V_{U\_P}$ monotonically increases according to the upper m bits, and the second upper voltage $V_{U\_N}$ monotonically decreases according to the upper m bits, such that they have a complementary relation.

In contrast, the first lower voltage $V_{L\_P}$ monotonically decreases according to the lower (n–m) bits, and the second lower voltage $V_{L\_N}$ monotonically increases according to the lower (n–m) bits, such that they have a complementary relation.

The first amplifier 430 receives the voltage $V_{U\_P}$, which is one from among the first upper voltage $V_{U\_P}$ and the second upper voltage $V_{U\_N}$, and the voltage $V_{L\_P}$, which is one from among the first lower voltage $V_{L\_P}$ and the second lower voltage $V_{L\_N}$, and outputs $V_{DAC\_P}$, which is one component of the differential analog signal.

The second amplifier 440 has the same configuration as that of the first amplifier 430. The second amplifier 440 receives $V_{U\_L}$, which is the other from among the first upper voltage $V_{U\_P}$ and the second upper voltage $V_{U\_N}$, and $V_{L\_N}$, which is the other from among the first lower voltage $V_{L\_P}$ and the second lower voltage $V_{L\_N}$, and outputs the other component $V_{DAC\_N}$ of the differential analog signal.

The first amplifier 430 is a subtraction amplifier configured to receive the first upper voltage $V_{U\_P}$ via its non-inverting input terminal (+), and to receive the first lower voltage $V_{L\_P}$ via its inverting input terminal (−). The output voltage $V_{DAC\_P}$ thereof is represented by the following Expression (1).

$$V_{DAC\_P}=g\times(V_{U\_P}-V_{L\_P}) \quad (1)$$

The second amplifier 440 is a subtraction amplifier configured to receive the second upper voltage $V_{U\_N}$ via its non-inverting terminal (+), and to receive the second lower voltage $V_{L\_N}$ via its inverting input terminal (−). The output voltage $V_{DAC\_P}$ thereof is represented by the following Expression (2).

$$V_{DAC\_N}=g\times(V_{U\_N}-V_{L\_N}) \quad (2)$$

Figure 8A:
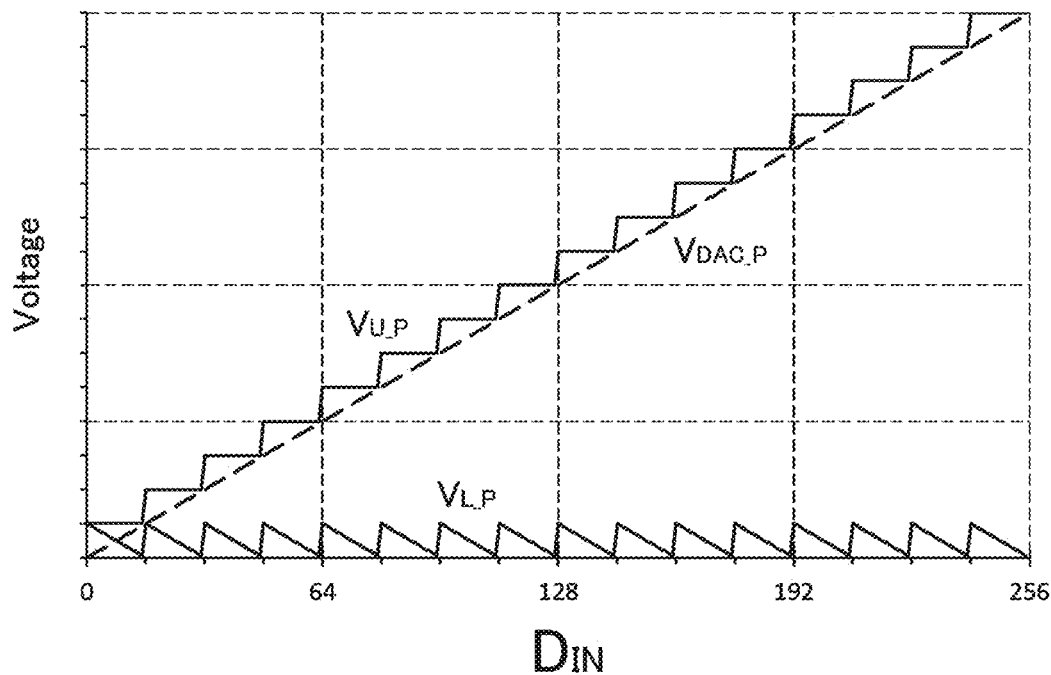
FIGS. 8A and 8B are diagrams each showing input/output characteristics of the D/A converter shown in FIG. 7.
Figure 8B:
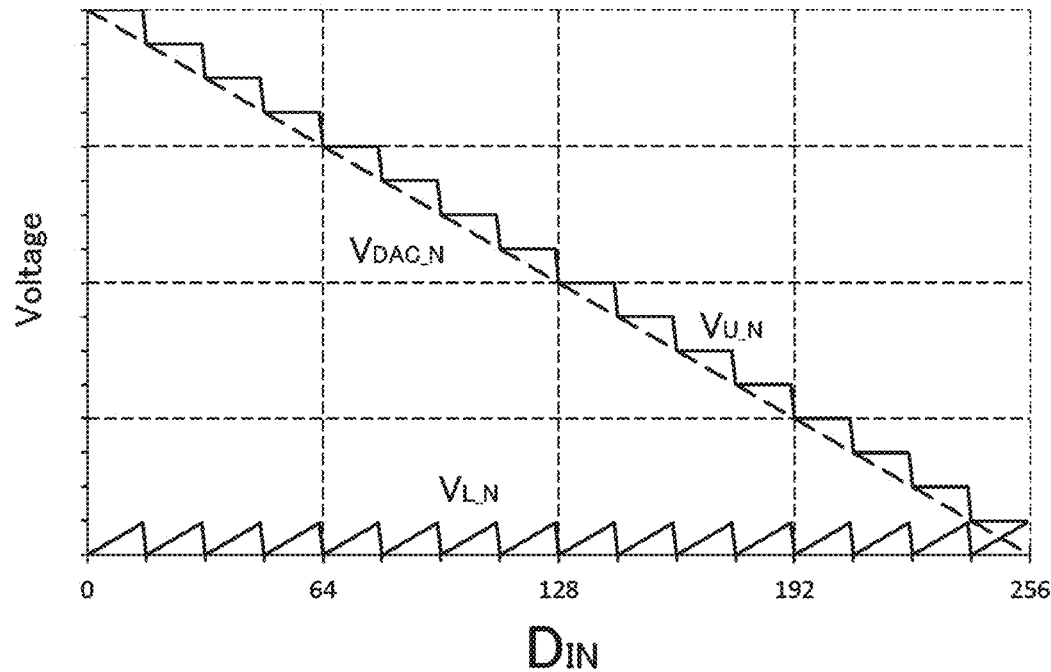

The above is the configuration of the D/A converter 400. Next, description will be made regarding the operation thereof. FIGS. 8A and 8B are diagrams each showing the input/output characteristics of the D/A converter 400 shown in FIG. 7. The horizontal axis represents the value of the digital signal $D_{IN}$, and the vertical axis represents the voltage. Here, for simplification of explanation, description will be made regarding an arrangement in which n=16, and m=4.

FIG. 8A shows the upper voltage $V_{U\_P}$, the lower voltage $V_{L\_P}$, and the output voltage $V_{DAC\_P}$, which is a difference between the upper voltage $V_{U\_P}$ and the lower voltage $V_{L\_P}$. FIG. 8B shows the upper voltage $V_{U\_N}$, the lower voltage $V_{L\_N}$, and the output voltage $V_{DAC\_N}$, which is a difference between the upper voltage $V_{U\_N}$ and the lower voltage $V_{L\_N}$. The ranges of the lower voltages $V_{L\_P}$ and $V_{L\_N}$ are equal to the step widths of the upper voltages $V_{U\_P}$ and $V_{U\_N}$, respectively.

The output voltage $V_{DAC\_P}$ monotonically increases with respect to the digital signal $D_{IN}$. The output voltage $V_{DAC\_N}$ monotonically decreases with respect to the digital signal $D_{IN}$. The two output voltages $V_{DAC\_P}$ and $V_{DAC\_N}$ are configured as components of a differential signal.

Figure 9A:
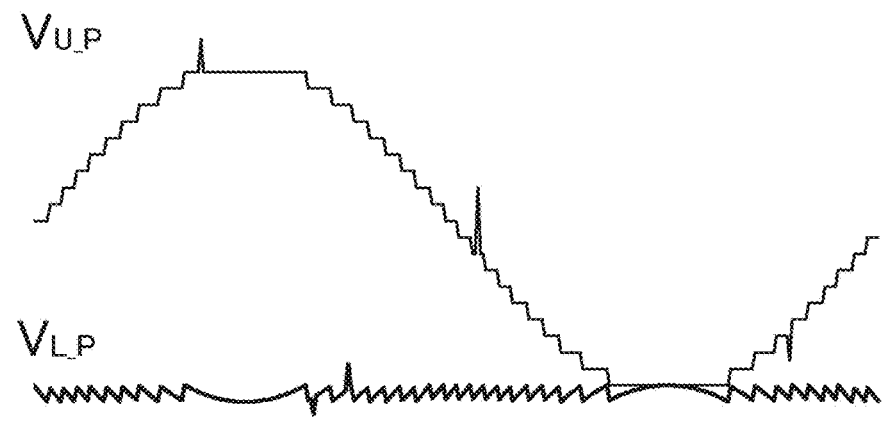
FIGS. 9A through 9C are operation waveform diagrams of the D/A converter.
Figure 9B:
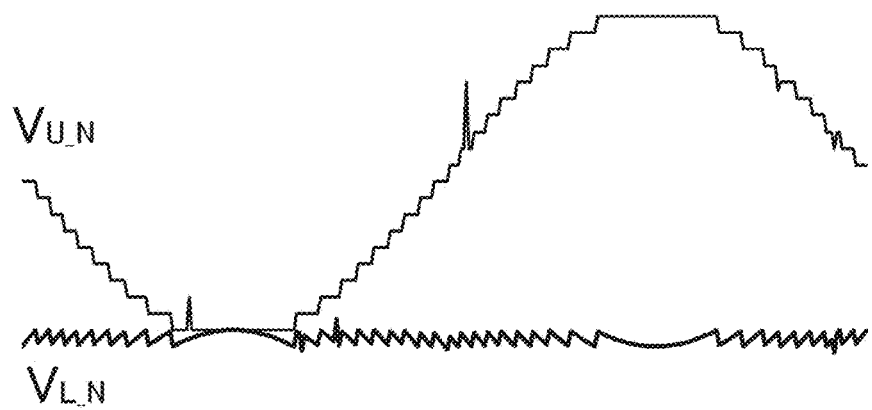
Figure 9C:
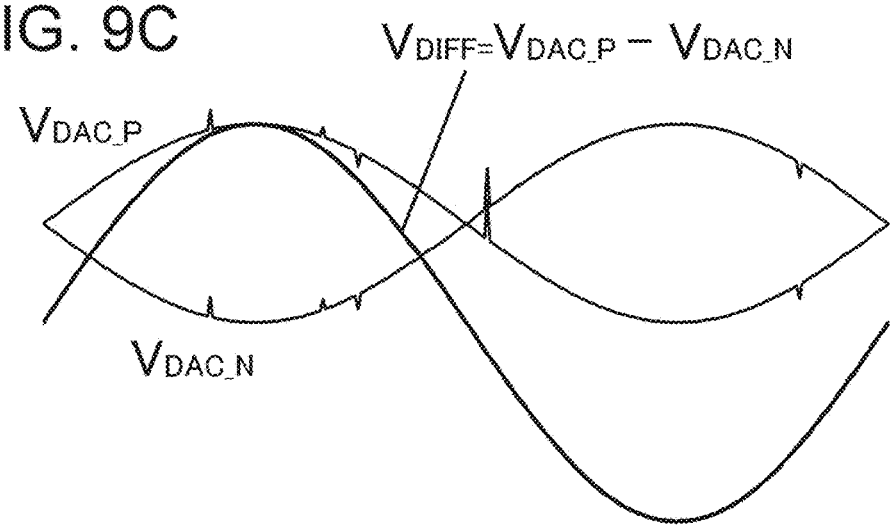

Next, description will be made regarding improvement of the noise characteristics of the D/A converter 400. FIGS. 9A through 9C are operation waveform diagrams of the D/A converter 400.

Here, description will be made below regarding an arrangement in which the digital signal $D_{IN}$ is designed to provide a sine wave. The first upper voltage $V_{U\_P}$ and the second upper voltage $V_{U\_N}$ are generated by the same upper conversion unit 410. Accordingly, the first upper voltage $V_{U\_P}$ and the second upper voltage $V_{U\_N}$ include common mode noise. In the same manner, the first lower voltage $V_{L\_P}$ and the second lower voltage $V_{L\_N}$ are generated by the same lower conversion unit 420. Accordingly, the first lower voltage $V_{L\_P}$ and the second lower voltage $V_{L\_N}$ also include common mode noise. Accordingly, the output voltage $V_{DAC\_P}$ of the first amplifier 430 and the output voltage $V_{DAC\_N}$ of the second amplifier 440 include an opposite phase signal component and a common mode noise component.

The two output voltages $V_{DAC\_P}$ and $V_{DAC\_N}$, which are outputs of the D/A converter 400, are used as a differential signal. Accordingly, the difference between them, i.e., $V_{DIFF}=V_{DAC\_P}-V_{DAC\_N}$, is used as a signal component. The signal component $V_{DIFF}$ does not contain noise superimposed in the upper conversion unit 410 and the lower conversion unit 420.

The above is the operation of the D/A converter 400. With the D/A converter 400, this provides improved noise characteristics.

The waveform diagram in FIG. 9 shows a noise cancelation effect of canceling noise components in the playback of an audio signal. This noise cancelation effect becomes further marked in a small-signal state or a no-signal state.

In the following description, the noise components that occur in the upper conversion unit 410 and the lower conversion unit 420 will each be represented by $V_{X\_Y}$ (it should be noted that X=U or L, Y=P or N). In a small-signal state, $V_{U\_P}\approx V_{U\_N}$ and $V_{L\_P}\approx V_{L\_N}$ hold true. In this case, the noise components that occur in a resistance component are canceled in the BTL output. In a no-signal state, $V_{U\_P}=V_{U\_N}$ and $V_{L\_P}=V_{L\_N}$ hold true. In this case, the noise components that occur in a resistance component are also canceled in the BTL output.

Figure 10:
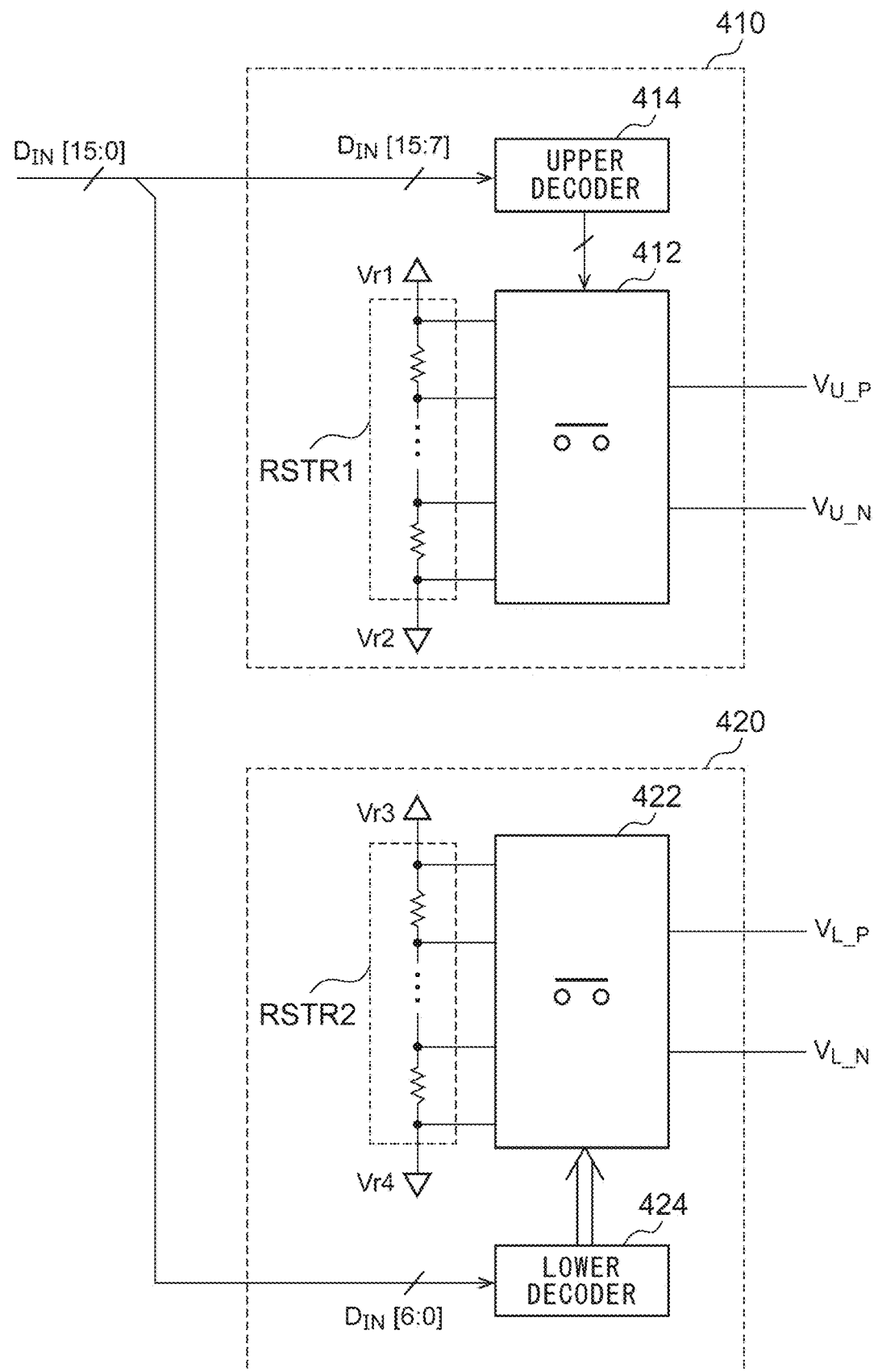
FIG. 10 is a circuit diagram showing an example configuration of an upper conversion unit and a lower conversion unit.

FIG. 10 is a circuit diagram showing an example configuration of the upper conversion unit 410 and the lower conversion unit 420. The upper conversion unit 410 includes an upper resistor string RSTR1, an upper selector 412, and an upper decoder 414. The upper resistor string RSTR1 includes multiple ($2^m-1=511$) resistor elements coupled in series. Each coupling node that couples the adjacent resistor elements is provided with a tap. A first reference voltage Vr1 is applied to one end of the upper resistor string RSTR1, and a second reference voltage Vr2 is applied to the other end thereof. The upper selector 412 is coupled to the multiple taps provided to the upper resistor string RSTR1. The upper selector 412 includes multiple internal switches. The upper decoder 414 controls the upper selector 412, and selects the voltages $V_{U\_P}$ and $V_{U\_N}$ that occur at two taps based on the upper m bits $D_{IN}[15:7]$. Specifically, the upper selector 412 selects two taps at symmetrical positions with the center tap as the center.

In the same way, the lower conversion unit 420 includes a lower resistor string RSTR2, a lower selector 422, and a lower decoder 424. The lower resistor string RSTR2 includes multiple ($2^{n-m}-1=127$) resistor elements coupled in series. Each coupling node that couples the adjacent resistor elements is provided with a tap. A third reference voltage Vr3 is applied to one end of the lower resistor string RSTR2, and a fourth reference voltage Vr4 is applied to the other end thereof. The lower selector 422 is coupled to the multiple taps provided to the lower resistor string RSTR2. The lower selector 422 includes multiple internal switches. The lower decoder 424 controls the lower selector 422, and selects the voltages $V_{L\_P}$ and $V_{L\_N}$ that occur at two taps based on the lower (m−m) bits $D_{IN}[6:0]$. Specifically, the lower selector 422 selects two taps at symmetrical positions with the center tap as the center.

Also, an arrangement may be made in which Vr2=Vr3. However, the present invention is not restricted to such an arrangement.

Figure 11:
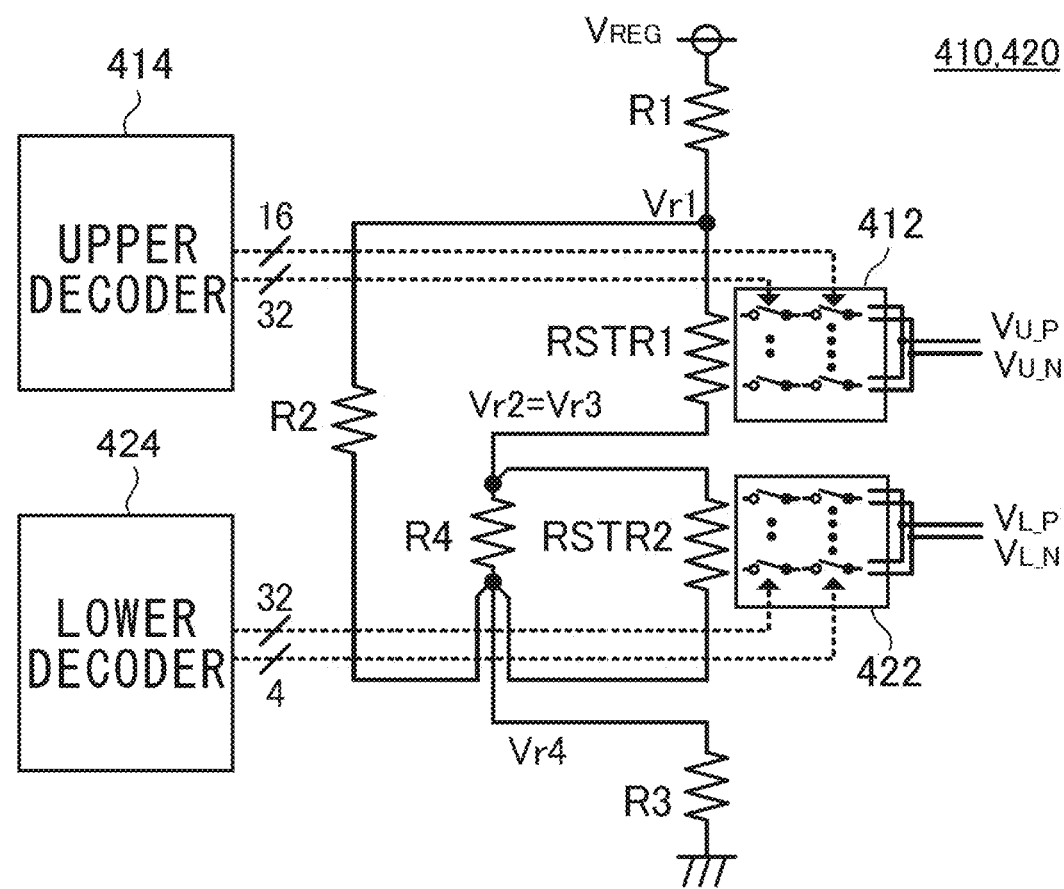
FIG. 11 is a circuit diagram showing a specific example configuration of the upper conversion unit and the lower conversion unit.

FIG. 11 is a circuit diagram showing a specific example configuration of the upper conversion unit 410 and the lower conversion unit 420. The upper conversion unit 410 and the lower conversion unit 420 include a first resistor R1, a second resistor R2, a third resistor R3, and a fourth resistor R4, in addition to the upper resistor string RSTR1 and the lower resistor string RSTR2. The first resistor R1 through the third resistor R3 are provided in series between the reference voltage terminal $V_{REG}$ and the ground. The fourth resistor R4 is coupled in parallel with the lower resistor string RSTR2.

If the resistors R1 through R4 are not provided, it is necessary to design the resistance elements of the lower resistor string RSTR2 to have resistance values that are 1/127 times those of the upper resistor string RSTR1. With this configuration, by appropriately determining the resistors R1, R2, R3, and R4, this allows the upper resistor string RSTR1 and the lower resistor string RSTR2 to be configured such that the resistor elements thereof have the same resistance values.

The first resistor R1, the second resistor R2, and the third resistor R3 are preferably paired. Furthermore, the upper resistor string RSTR1, the lower resistor string RSTR2, and the fourth resistor R4 are preferably paired. With this, the effects of resistance variation are canceled, thereby allowing characteristics such as integral nonlinearity, differential nonlinearity, etc., to be improved.

Figure 12:
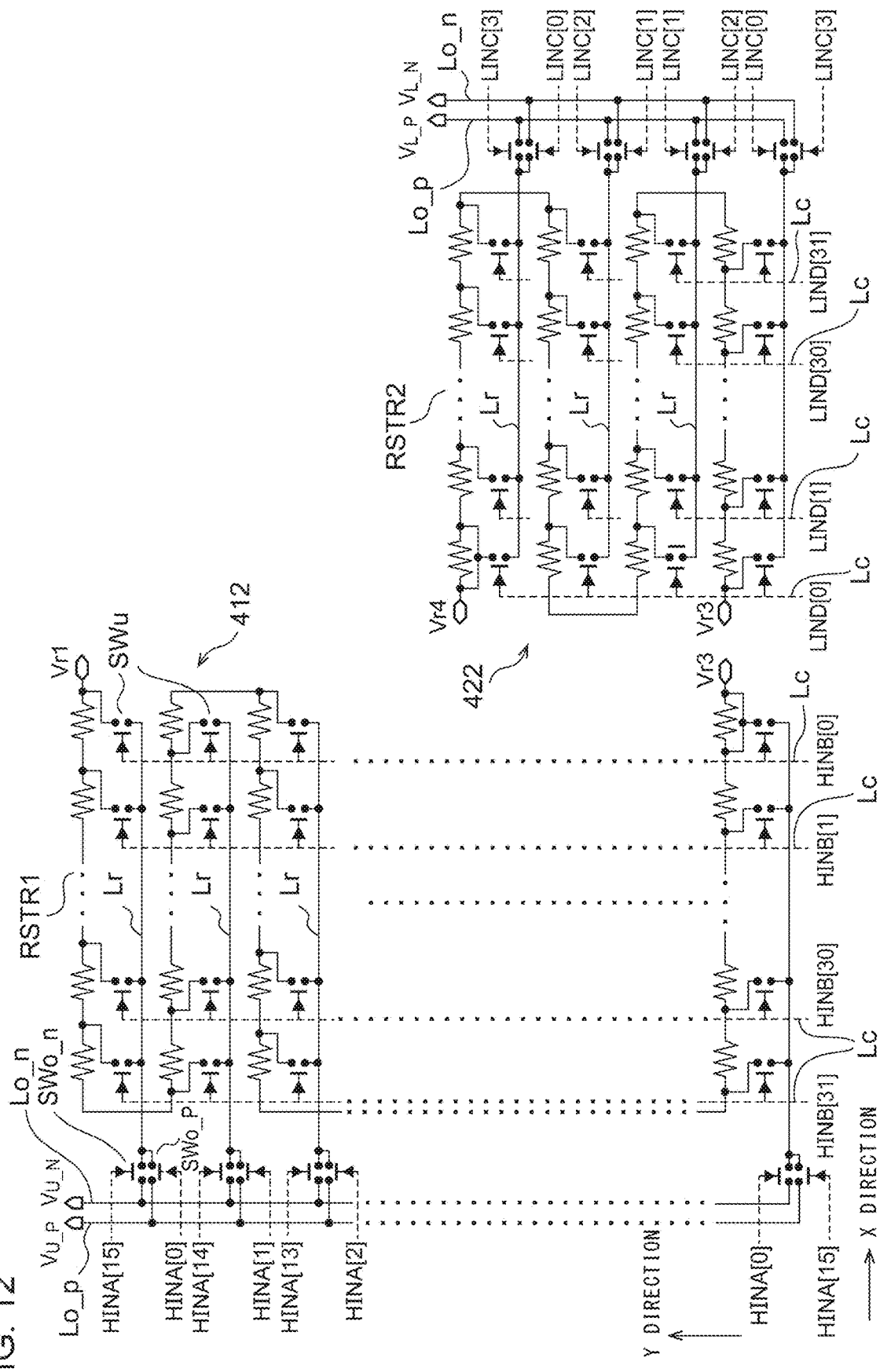
FIG. 12 is a circuit diagram showing an upper selector and a lower selector shown in FIG. 11.

Description will be made with reference to FIG. 12 regarding the configuration of the upper selector 412 and the lower selector 422. FIG. 12 is a circuit diagram of the upper selector 412 and the lower selector 422 shown in FIG. 11.

The upper resistor string RSTR1 includes $2^m=512$ resistor elements each having a meander structure. The multiple taps are arranged in a matrix with A rows and B columns. Specifically, bars each including B=32 resistor elements in the X direction are arranged such that they turn back. Accordingly, in this example, a matrix with A=16 and B=32 is shown. It should be noted that the resistor element on the lowest electric potential (Vr3) side is short-circuited.

The upper selector 412 includes multiple ($2^m=512$) upper switches SWu arranged in a matrix with A rows and B columns, A row lines Lr, B column lines Lc, A first output switches SWo_p, and A second output switches SWo_n. One end of each upper switch SWu is coupled to the corresponding tap. The other end of the multiple upper switches SWu of the i-th row ($1 \le i \le A$) are each coupled to the i-th row line Lr. The control terminals of the multiple upper switches SWu of the j-th column ($1 \le j \le B$) are each coupled to the j-th column line Lc.

One end of each of the A first output switches SWo_p is coupled to the first output line Lo_p. The other end of each first output switch SWo_p is coupled to the corresponding one from among the A row lines Lr. One end of each of the A second output switches SWo_n is coupled to the second output line Lo_n. The other end thereof is coupled to the corresponding one from among the A row lines Lr. Preferably, the multiple upper switches are each configured as a CMOS (Complementary Metal Oxide Semiconductor) switch.

The upper decoder 414 generates 32-bit data HINB [31:0] to be applied to the multiple column lines Lc.

Furthermore, the upper decoder 414 generates a control signal HINA [15:0] to be applied to the multiple first output switches SWo_p. The control signals HINA [15:0] are assigned to the multiple second output switches SWo_n in reverse order.

The lower resistor string RSTR2 and the lower selector 422 are configured in the same manner. The lower resistor string RSTR2 includes $2^{n-m}=128$ resistor elements each having a meander structure. The multiple taps are arranged in a matrix with C rows and D columns. Specifically, bars each including D=32 resistor elements in the X direction are arranged such that they turn back. Accordingly, in this example, a matrix with C=4 and D=32 is shown. It should be noted that the resistor element on the lowest electric potential (Vr4) side is short-circuited.

The lower selector 422 includes multiple ($2^{n-m}=256$) lower switches SW1 arranged in a matrix with C rows and D columns, C row lines Lr, D column lines Lc, C third output switches SWo_p, and C second output switches SWo_n. One end of each lower switch SW1 is coupled to the corresponding tap. The other end of each of the multiple lower switches SW1 of the i-th row ($1 \le i \le C$) is coupled to the i-th row line Lr. The control terminals of the multiple lower switches SW1 of the j-th column ($1 \le j \le B$) are each coupled to the j-th column line Lc.

One end of each of the C third output switches SWo_p is coupled to the third output line Lo_p. The other end of each third output switch SWo_p is coupled to the corresponding one from among the C row lines Lr. One end of each of the C fourth output switches SWo_n is coupled to the fourth output line Lo_n. The other end thereof is coupled to the corresponding one from among the C row lines Lr. Preferably, the multiple lower switches are each configured as an NMOS (N-channel Metal Oxide Semiconductor) switch.

The lower decoder 424 generates 32-bit data HINC [31:0] HINC [31:0] to be applied to the multiple column lines Lc.

Furthermore, the lower decoder 424 generates a control signal LIND [15:0] to be applied to the multiple third output switches SWo_p. The control signals LIND [15:0] are assigned to the multiple fourth output switches SWo_p in reverse order.

With this configuration in which the upper resistor string RSTR1 and the lower resistor string RSTR2 are arranged so as to have a meander structure, and the switches are arranged in a matrix, this allows the number of control lines to be reduced.

If the upper selector 412 is provided with different selectors each configured to acquire the first upper voltage $V_{U\_P}$ and different selectors configured to acquire the second upper voltage $V_{U\_N}$, such an arrangement requires an enormous number of switches. Specifically, the number of required switches is (A×B×2)=(512×2)=1024. In contrast, with such an arrangement shown in FIG. 12, this allows the number of switches to be reduced to (A×B+(A×2)=512+32=544. This provides the same effects for the lower selector 422.

Figure 13:
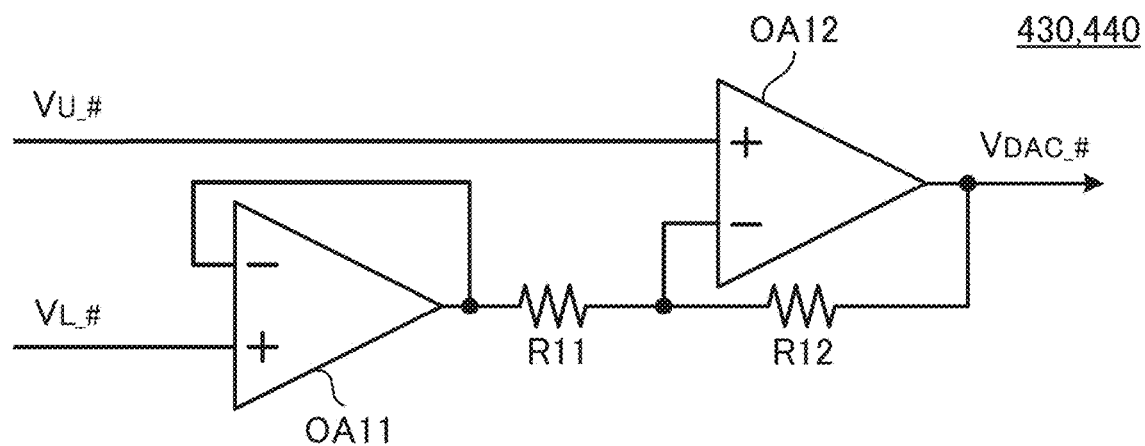
FIG. 13 is a circuit diagram showing an example configuration of a first amplifier and a second amplifier.

FIG. 13 is a circuit diagram showing an example configuration of the first amplifier 430 and the second amplifier 440. As described above, the first amplifier 430 and the second amplifier 440 have the same configuration including operational amplifiers OA11 and OA12 and resistors R11 and R12. The operational amplifier OA1 is configured as a buffer (voltage follower) and is configured to receive the lower voltage $V_{L\_\#}$ (#=P, N). The operational amplifier OA2 and the resistors R11 and R12 form a subtraction amplifier (subtraction circuit) and are configured to output a voltage $V_{DAC\#}$ that corresponds to a difference between the two input voltages $V_{U\_\#}$ and $V_{L\_\#}$.

Next, description will be made regarding a modification of the D/A converter 400.

Description has been made in the embodiment regarding an arrangement in which the first lower voltage $V_{U\_P}$ monotonically decreases according to the lower bits of the digital signal $D_{IN}$, and the second lower voltage $V_{U\_N}$ monotonically increases according to the lower bits of the digital signal $D_{IN}$. However, the present invention is not restricted to such an arrangement. Also, an arrangement may be made in which the first lower voltage $V_{U\_P}$ monotonically increases according to the lower bits of the digital signal $D_{IN}$, and the second lower voltage $V_{U\_N}$ monotonically decreases according to the lower bits of the digital signal $D_{IN}$. In this case, the first amplifier 430 and the second amplifier 440 may each be preferably configured as an adder circuit instead of a subtraction circuit.

$$V_{DAC\_P} = g \times (V_{U\_P} + V_{L\_P})$$

$$V_{DAC\_N} = g \times (V_{U\_N} + V_{L\_N})$$

Description has been made in the embodiment regarding an arrangement in which the upper conversion unit 410 and the lower conversion unit 420 are each configured using a resistor voltage dividing method. However, the present invention is not restricted to such an arrangement. Also, the upper conversion unit 410 and the lower conversion unit 420 may each be configured as a D/A converter using a different method.

As the reference voltage $V_{REG}$ shown in FIG. 11, a reference voltage $V_{FILA}$ that corresponds to the voltage applied to the volume setting pin FILA may preferably be applied.

Figure 14:
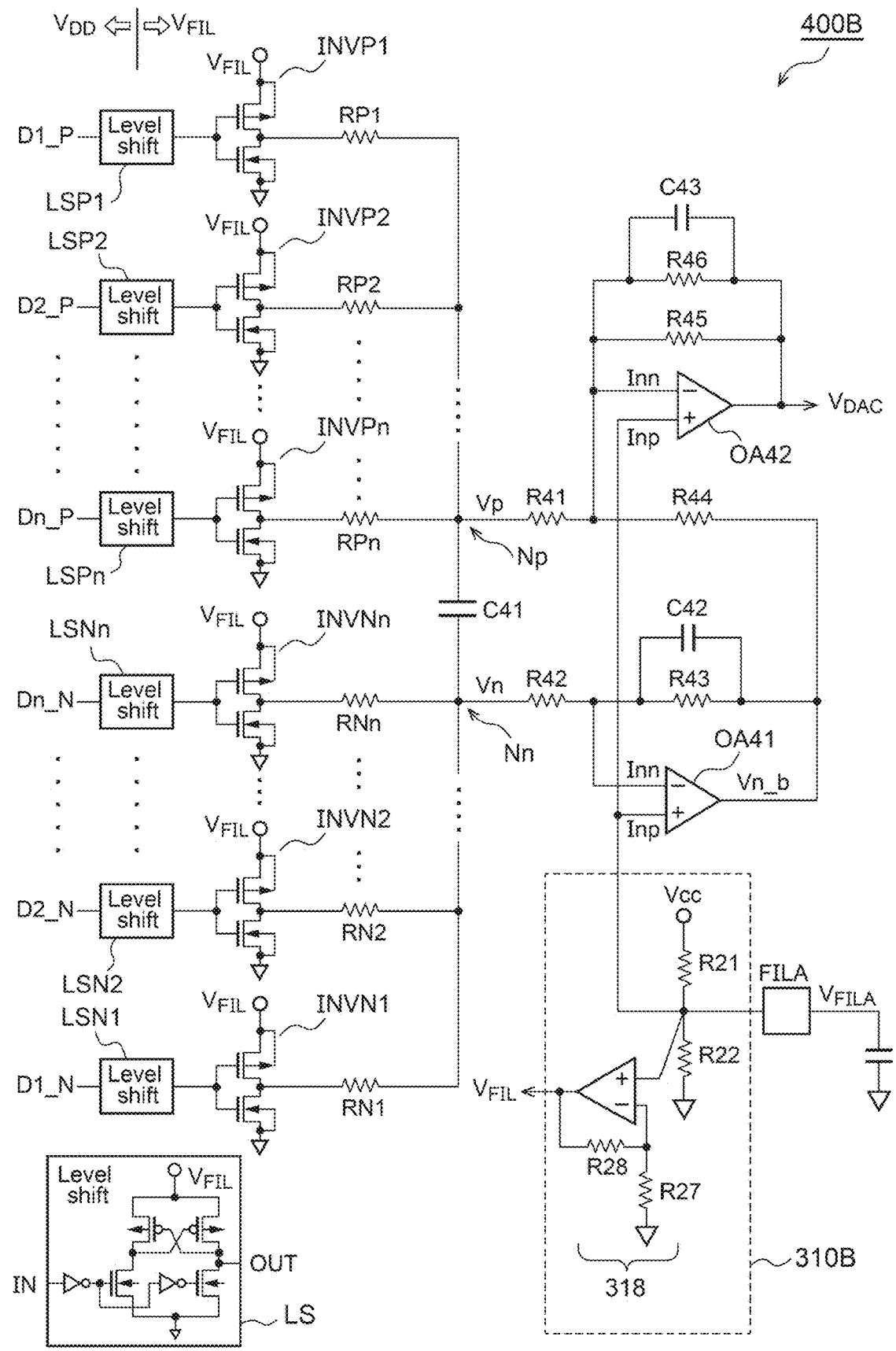
FIG. 14 is a diagram showing another example configuration of the D/A converter and a bias circuit.

FIG. 14 is a diagram showing another example configuration (400B) of the D/A converter 320 and a bias circuit 310B. The D/A converter 400B is configured as an inverter-type D/A converter. The D/A converter 400B receives inputs of thermometer code D1_P through Dn_P and D1_N through Dn_N configured as differential signal components. Accordingly, as an upstream stage of the D/A converter 400B, a converter (not shown) is provided such that it converts an audio signal $D_{IN}$ received by the digital audio interface circuit 330 shown in FIG. 3 into a thermometer code.

The D/A converter 400B includes multiple level shifters LSP1 through LSPn and LSN1 through LSNn, multiple inverters INVP1 through INVPn and INVN1 through INVNn, resistors RP1 through RPn and RN1 through RNn, capacitors C41 through C43, and resistors R41 through R46.

The bias circuit 310B generates the reference voltage $V_{FIL}$ that corresponds to the voltage $V_{FILA}$ applied to the volume setting pin FILA. In this example, the bias circuit 310B includes a non-inverting amplifier 318, and outputs the reference voltage $V_{FIL}$ having a voltage level obtained by multiplying the setting voltage $V_{FILA}$ by a gain ($\times$(R27+R28)/R27).

The reference voltage $V_{FIL}$ is supplied to the multiple inverters INVP1 through INVPn and INVN1 through INVNn. The positive thermometer code D1_P through Dn_P is supplied to the gates of the inverters INVP1 through INVPn via the level shifters LSP1 through LSPn. When the i-th bit Di_P of the thermometer code is set to the high level, the corresponding inverter INVPi outputs a high voltage, i.e., the reference voltage $V_{FIL}$. Conversely, when the i-th bit Di_P of the thermometer code is set to the low level, the corresponding inverter INVPi outputs a low voltage, i.e., 0 V.

The voltage Vp that occurs at the connection node Np of the multiple resistors RP1 through RPn is proportional to the value of the thermometer code D1_P through Dn_P (the number of ones).

The negative thermometer code D1_N through Dn_N is supplied to the gates of the inverters INVN1 through INVNn via the level shifters LSN1 through LSNn. The voltage Vn that occurs at the connection node Nn of the multiple resistors RN1 through RNn is proportional to the value of the thermometer code D1_N through Dn_N (the number of ones).

The operational amplifier OA41 and the resistors R42 and R43 form an inverting amplifier. The inverting amplifier inverts the voltage Vn so as to generate the voltage Vn_b.

The resistors R41, R44, and R45 and the operational amplifier OA42 form an inverting adder. The inverting adder adds the voltage Vn_b and Vp and inverts and amplifies the sum of the voltages thus added so as to generate the output voltage $V_{DAC}$ of the D/A converter 400B.

Figure 15:
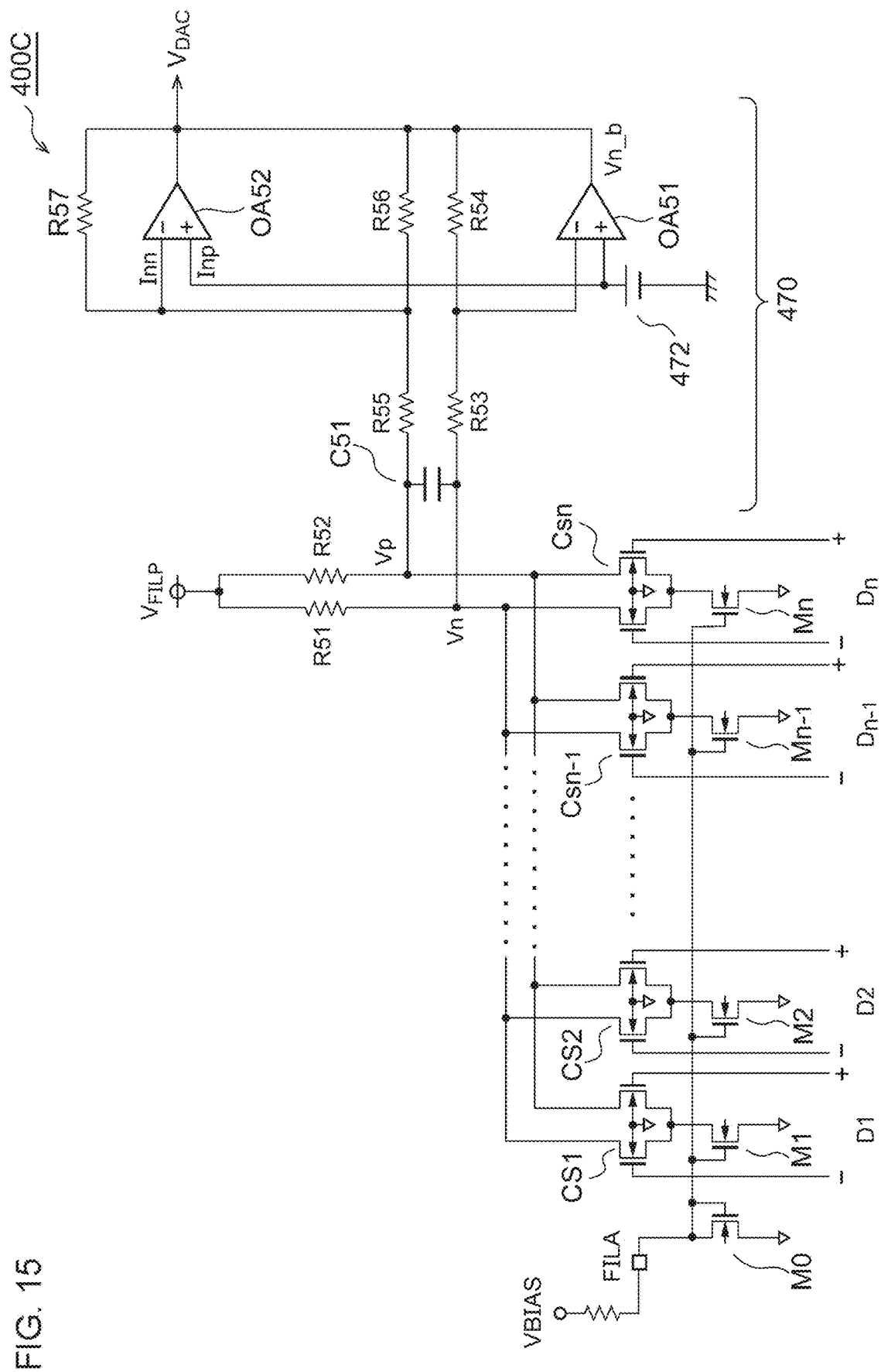
FIG. 15 is a diagram showing yet another example configuration of the D/A converter.

FIG. 15 is a diagram showing another example configuration (400C) of the D/A converter 320. The D/A converter 400 is configured as a current addition type D/A converter including a bias transistor M0, multiple current sources CS1 through CSn, resistors R51 and R52, and an output stage 470. The D/A converter 400C receives an input of a differential thermometer code D1 through Dn.

The i-th current source CS includes a differential pair and a transistor Mi that functions as a tail current source. The transistors M1 through Mn form a current mirror circuit with the transistor M0 as its input. The drain of the transistor M0 is coupled to the volume setting terminal FILA. A bias signal VBIAS is supplied to the volume setting terminal FILA. Such an arrangement allows the currents that flow through the transistors M0 through Mn to be set according to the bias signal VBIAS.

The reference voltage $V_{FILP}$ is supplied to one end of each of the resistors R51 and R52. One end (left side in the drawing) of each differential pair CS1 through CSn of the current sources is coupled to the second end of the resistor R51. The other end (right side in the drawing) of each differential pair of the current sources CS1 through CSn is coupled to the second end of the resistor R52.

The output stage 470 outputs the voltage $V_{DAC}$ that corresponds to a difference between the voltages Vn and Vp that occur at the second ends of the resistors R51 and R52. The configuration of the output stage 470 is not restricted in particular. For example, the output stage 470 includes a capacitor C51, resistors R53 through R7, a reference voltage source 472, and operational amplifier OA51 and OA52.

The operational amplifier OA51 and the resistors R53 and R54 form an inverting amplifier. The inverting amplifier inverts and amplifies the voltage Vn so as to output the voltage Vn_b.

The operational amplifier OA52 and the resistors R55 through R57 form an inverting summing amplifier. The inverting summing amplifier adds the voltage Vp and the voltage Vn_b, and inverts and amplifies the sum of the voltages Vp and Vn_b so as to generate the output voltage $V_{DAC}$ of the D/A converter 400C.

Usage

Figure 16:
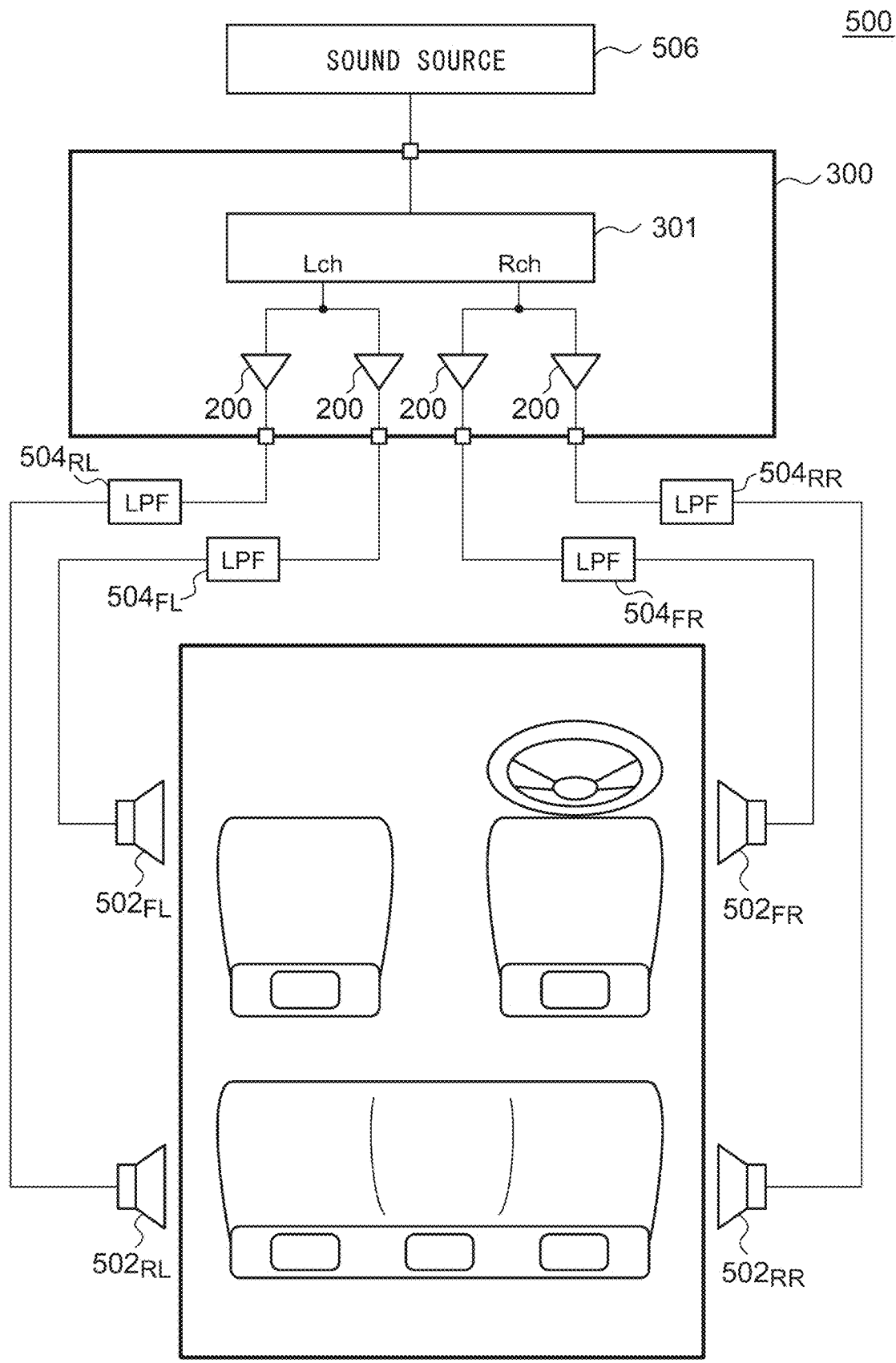
FIG. 16 is a block diagram of an in-vehicle audio system employing the audio circuit according to the embodiment.

Description will be made regarding the usage of the audio circuit 300. FIG. 16 is a block diagram showing an in-vehicle audio system employing the audio circuit according to the embodiment.

An in-vehicle audio system 500 includes four speakers $502_{FL}$, $502_{FR}$, $502_{RL}$, and $502_{RR}$, four filters $504_{FL}$, $504_{FR}$, $504_{RL}$, and $504_{RR}$, a sound source 506, and an audio circuit 300.

The sound source 106 outputs a left-and-right (LR) two-channel or multi-channel digital audio signal. The audio circuit 300 includes a four-channel class D amplifier circuit 200 and an interface circuit 301 for communicating with the sound source 106. The interface circuit 301 can be regarded as the digital interface circuit 330 and the D/A converter 320 shown in FIG. 3.

The filter 504, the sound source 506, and the audio circuit 300 are built into an audio head unit or a car navigation apparatus. Alternatively, the audio circuit 300 may be a product independent of the sound source 106.

Figure 17A:
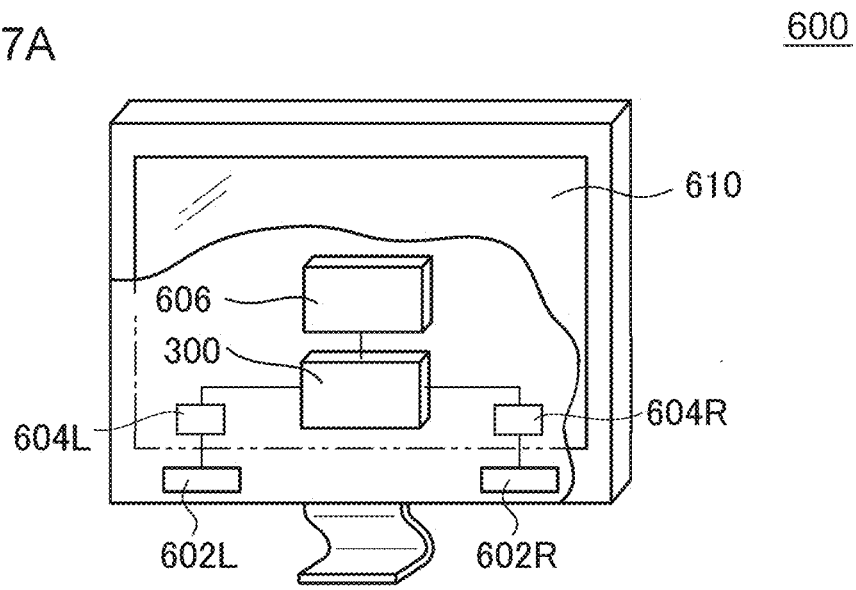
FIGS. 17A and 17B are diagrams each showing an electronic device employing the audio circuit according to the embodiment.
Figure 17B:
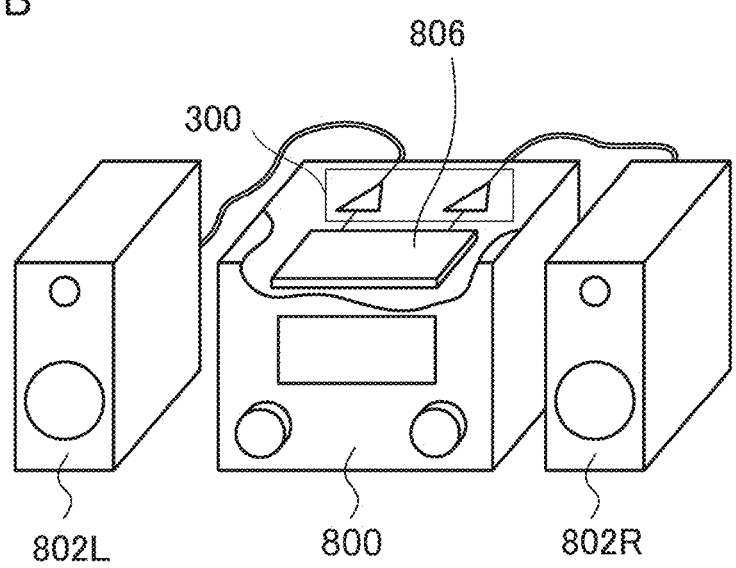

FIGS. 17A and 17B are diagrams each showing an electronic device employing the audio circuit according to the embodiment. The electronic device shown in FIG. 17A is a display apparatus 600 such as a TV, etc. The display apparatus 600 includes speakers 602L and 602R, filters 604L and 604R, a sound source 606, an audio circuit 300, and a display panel 610.

The electronic device shown in FIG. 17B is an audio component apparatus 800. The audio component apparatus 800 includes an audio signal processing circuit 806 that corresponds to a sound source, an audio circuit 300, and an unshown filter. The audio circuit 300 drives speakers 802L and 802R coupled via speaker cables.

The above-described embodiments have been described for exemplary purposes only. Rather, it can be readily conceived by those skilled in this art that various modifications may be made by making various combinations of the aforementioned components or processes. Description will be made below regarding such modifications.

Description has been made in the embodiment regarding an example employing a half-bridge type class D amplifier. Also, the present invention is applicable to a full-bridge type (BTL: Bridge-Tied Load) class D amplifier. In this case, the DC block capacitor of the low pass filter 104 becomes unnecessary. Furthermore, with the full-bridge type class D amplifier, a filterless modulation method may be employed in which the low-pass filter 104 is omitted.

What is claimed is:
1. An audio circuit comprising:
a volume setting pin structured to receive an analog voltage;
a power supply pin structured to receive a power supply voltage;
a bias circuit structured to generate a first reference voltage that corresponds to the analog voltage;
a D/A converter structured to convert a digital audio signal into an analog audio signal with a voltage range having a full scale that is variable according to the first reference voltage; and
a class D amplifier structured to output an output pulse signal having a duty cycle that corresponds to the analog audio signal output from the D/A converter and having an amplitude that corresponds to the power supply voltage.
2. The audio circuit according to claim 1, wherein the bias circuit comprises:
a first resistor provided between the volume setting pin and the power supply pin; and
a second resistor provided between the volume setting pin and a ground.
3. The audio circuit according to claim 1, wherein the class D amplifier comprises:
an integrator structured to receive the analog audio signal and the output pulse signal;
a periodic voltage generating circuit structured to generate a periodic voltage having a triangle waveform or a sawtooth waveform;
a Pulse Width Modulation (PWM) comparator structured to compare an output of the integrator with the periodic voltage;
a bridge circuit; and
a driver structured to drive the bridge circuit according to an output of the PWM comparator.
4. The audio circuit according to claim 3, wherein the bias circuit further generates a second reference voltage obtained by dividing the power supply voltage in addition to the first reference voltage,
and wherein the second reference voltage is supplied to the integrator.
5. The audio circuit according to claim 4, wherein the periodic voltage generating circuit generates a periodic voltage with the second reference voltage as a midpoint level.
6. The audio circuit according to claim 1, monolithically integrated on a single substrate.
7. An in-vehicle audio system comprising:
a speaker; and
the audio circuit according to claim 1, structured to drive the speaker.
8. An electronic device provided with the audio circuit according to claim 1.

* * * * *